(12) United States Patent
Chen et al.

(10) Patent No.: US 12,218,005 B2
(45) Date of Patent: Feb. 4, 2025

(54) INTEGRATED CIRCUIT DEVICE

(71) Applicant: TAIWAN SEMICONDUCTOR MANUFACTURING COMPANY, LTD., Hsinchu (TW)

(72) Inventors: Hsia-Wei Chen, Taipei (TW); Fu-Ting Sung, Taoyuan (TW); Yu-Wen Liao, New Taipei (TW); Wen-Ting Chu, Kaohsiung (TW); Fa-Shen Jiang, Taoyuan (TW); Tzu-Hsuan Yeh, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/422,726

(22) Filed: Jan. 25, 2024

(65) Prior Publication Data
US 2024/0162088 A1 May 16, 2024

Related U.S. Application Data

(63) Continuation of application No. 17/141,852, filed on Jan. 5, 2021, now Pat. No. 11,894,267.

(51) Int. Cl.
*H01L 21/768* (2006.01)
*H01L 23/528* (2006.01)
*H01L 23/532* (2006.01)

(52) U.S. Cl.
CPC .. *H01L 21/76877* (2013.01); *H01L 21/76802* (2013.01); *H01L 21/76832* (2013.01); *H01L 23/528* (2013.01); *H01L 23/53209* (2013.01)

(58) Field of Classification Search
CPC .... H10N 70/063; H10N 70/24; H10N 70/245; H10N 70/826; H10N 70/883; H10N 70/8833; H01L 21/76877; H01L 21/76802; H01L 21/76832; H10B 63/80; H10B 63/82; H10B 63/84; H10B 63/845
See application file for complete search history.

(56) References Cited

U.S. PATENT DOCUMENTS 7,718,988 B2    5/2010  Lee
10,038,139 B2   7/2018  Chen et al.
(Continued)

OTHER PUBLICATIONS

U.S. Appl. No. 17/032,155, filed Sep. 25, 2020.

*Primary Examiner* — Bac H Au
(74) *Attorney, Agent, or Firm* — Birch, Stewart, Kolasch & Birch, LLP

(57) ABSTRACT

An integrated circuit device includes an interconnect layer, a memory structure, a third conductive feature, and a fourth conductive feature. The interconnect layer includes a first conductive feature and a second conductive feature. The memory structure is over and in contact with the first conductive feature. The memory structure includes at least a resistance switching element over the first conductive feature. The third conductive feature, including a first conductive line, is over and in contact with the second conductive feature. The fourth conductive feature is over and in contact with the memory structure. The fourth conductive feature includes a second conductive line, a top surface of the first conductive line is substantially level with a top surface of the second conductive line, and a bottom surface of the first conductive line is lower than a bottommost portion of a bottom surface of the second conductive line.

20 Claims, 27 Drawing Sheets

(56) References Cited

U.S. PATENT DOCUMENTS

| | | |
|---|---|---|
| 11,258,012 B2 | 2/2022 | Koty et al. |
| 2009/0127604 A1 | 5/2009 | Noda |
| 2009/0140234 A1 | 6/2009 | Moniwa et al. |
| 2014/0021584 A1 | 1/2014 | Tu et al. |
| 2014/0070162 A1 | 3/2014 | Iwayama |
| 2015/0318333 A1 | 11/2015 | Narayanan et al. |
| 2018/0040817 A1 | 2/2018 | Chuang et al. |
| 2018/0097173 A1 | 4/2018 | Chuang et al. |
| 2018/0301624 A1 | 10/2018 | Yang et al. |
| 2018/0351099 A1 | 12/2018 | Yang et al. |
| 2018/0374895 A1 | 12/2018 | Hsu et al. |
| 2019/0131524 A1 | 5/2019 | Peng et al. |
| 2019/0165258 A1 | 5/2019 | Peng et al. |
| 2020/0035908 A1 | 1/2020 | Ku et al. |
| 2020/0066580 A1 | 2/2020 | Peng et al. |
| 2020/0075857 A1 | 3/2020 | Chou |
| 2020/0106011 A1 | 4/2020 | Chen et al. |
| 2020/0365655 A1 | 11/2020 | Chiu et al. |
| 2021/0013095 A1 | 1/2021 | Tran et al. |
| 2021/0035620 A1 | 2/2021 | Wang et al. |
| 2021/0217813 A1 | 7/2021 | Wang et al. |
| 2021/0272896 A1 | 9/2021 | Lin et al. |
| 2021/0351348 A1 | 11/2021 | Hsu et al. |
| 2022/0059618 A1 | 2/2022 | Hsu et al. |

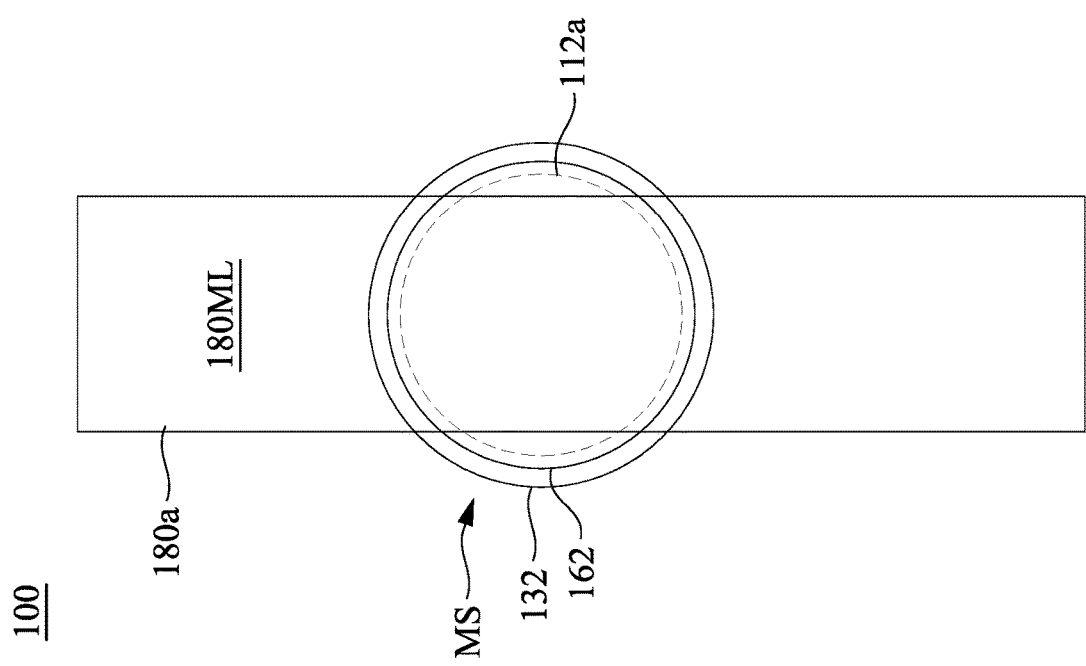

INTEGRATED CIRCUIT DEVICE

PRIORITY CLAIM AND CROSS-REFERENCE

This application is a continuation of U.S. patent application Ser. No. 17/141,852, filed Jan. 5, 2021, now U.S. Pat. No. 11,894,267, issued on Feb. 6, 2024, the entirety of which is incorporated by reference herein in its entirety.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, RRAM cell includes a resistance switching layer, the resistance of which can be adjusted to represent logic "0" or logic "1."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9B is a schematic top view of the integrated circuit device of FIG. 9A.

DETAILED DESCRIPTION

Figure 1:
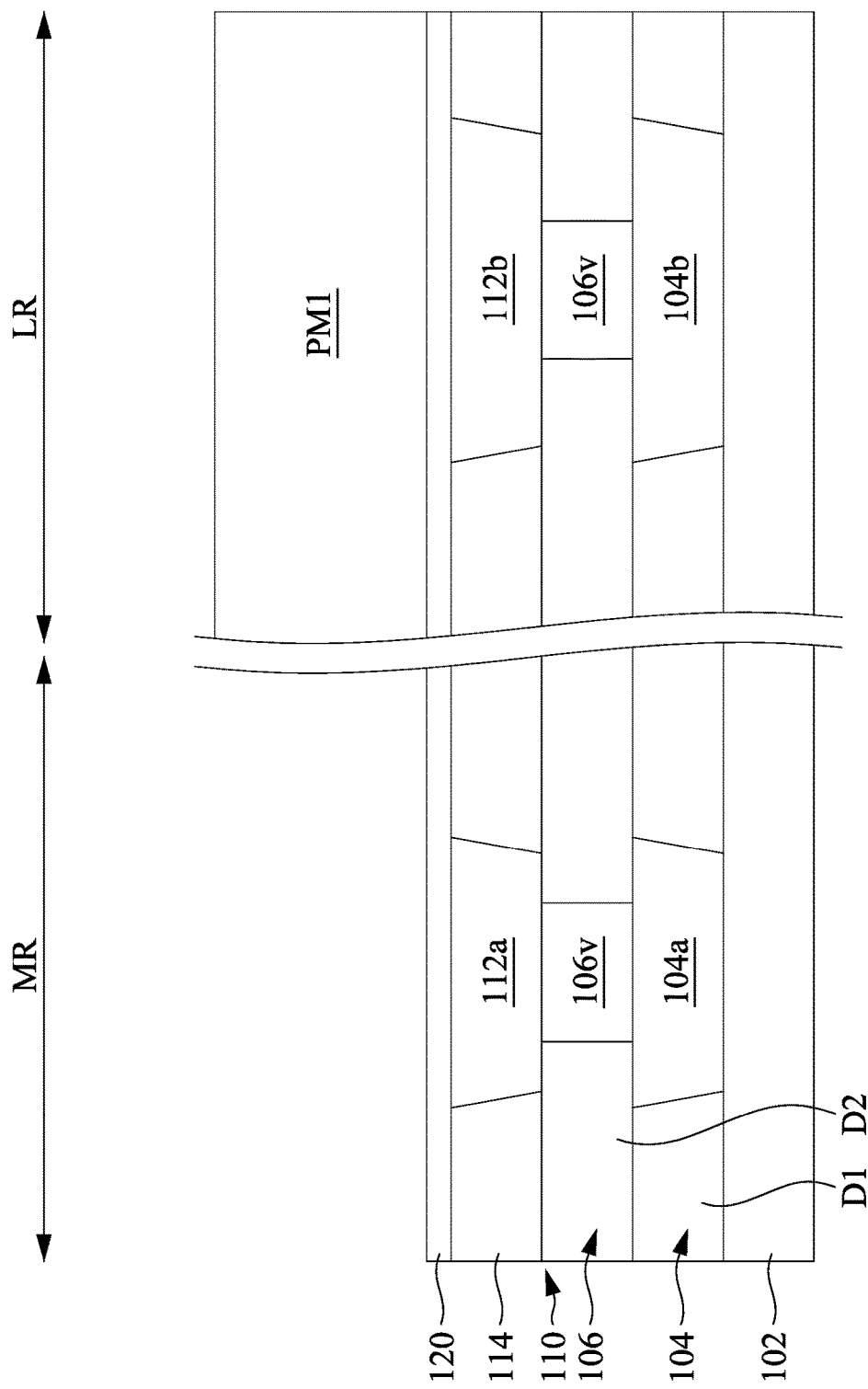
FIGS. 1-5B illustrate various stages in the fabrication process of an integrated circuit device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In integrated circuit (IC) devices, resistance-based random access memory, such as resistive random access memory (RRAM, ReRAM), magnetoresistive random access memory (MRAM), and phase-changed random access memory (PCRAM), are being developed for next generation memory devices. Compared with charge-based random access memory, such as flash memory, a resistance-based random access memory circuit includes an array of memory cells each of which is capable of having at least a high resistance state and a low resistance state. Setting a resistance state of a memory cell of a resistance-based random access memory circuit (i.e., performing a write operation to the memory cell) is usually accomplished by applying a predetermined voltage difference or a predetermined current to the memory cell. When reading a datum from a memory cell, a predetermined reading current (or voltage) is applied to the memory cell, and the output datum is determined according to the resulting voltage (or current) of the memory cell.

The resistance-based random access memory cell is exemplarily illustrated as a RRAM cell in the embodiments of the present disclosure. An RRAM cell may include a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes, and each state may represent a different digital value. The RRAM cell may switch from one state to another by applying a predetermined voltage or current to the RRAM cell. For example, the RRAM cell has a state of relatively high resistance, referred to as "a high resistance state", and a state of relatively low resistance, referred to as "a low resistance state". The RRAM cell may be switched from the high resistance state to the low resistance state, or from the low resistance state to high resistance state by applying a predetermined voltage or current. The RRAM cells can be used in One-Time Programmable (OTP) applications, multiple-time programmable (MTP) applications, etc. In some other embodiments of the present disclosure, the illustrated resistance-based random access memory cell can be MRAM cell, PCRAM cell, or the like, not limited to the RRAM cell.

An integrated circuit device having the memory cells and the method of fabricating the same are provided in accordance with various exemplary embodiments. The intermediate stages of forming the integrated circuit device are illustrated. The variations of the embodiments are discussed. Throughout the various views and illustrative embodiments, like reference numbers are used to designate like elements.

FIGS. 1-5B illustrate various stages in the fabrication process of an integrated circuit device according to some embodiments of the present disclosure. The illustration is merely exemplary and is not intended to limit beyond what is specifically recited in the claims that follow. It is understood that additional operations may be provided before, during, and after the operations shown by FIGS. 1-5B, and some of the operations described below can be replaced or eliminated for additional embodiments of the method. The order of the operations/processes may be interchangeable.

FIG. 1 illustrates a semiconductor substrate 102 having transistors and one or more interconnect layers (e.g., interconnect layers 104, 106, and 110) formed thereon. The semiconductor substrate 102 may be a silicon substrate. Alternatively, the substrate 102 may include another elementary semiconductor, such as germanium; a compound semiconductor including silicon carbide; an alloy semiconductor including silicon germanium; or combinations thereof. In some embodiments, the substrate 102 is a semiconductor on insulator (SOI) substrate. The substrate 102 may include doped regions, such as p-wells and n-wells. The transistors are formed by suitable transistor fabrication processes and may be a planar transistor, such as polysilicon gate transistors or high-k metal gate transistors, or a multi-gate transistor, such as fin field effect transistors. After the transistors are formed, one or more interconnect layers of a multi-level interconnect (MLI) (e.g., interconnect layers 104, 106, and 110) is formed over the transistors.

The interconnect layers 104, 106, and 110 includes conductive features 104a, 104b, 106v, 112a, and 112b embedded in an inter-layer dielectric (ILD) layer 114. The ILD layers 104, 106, 114 may be silicon oxide, fluorinated silica glass (FSG), carbon doped silicon oxide, tetra-ethyl-ortho-silicate (TEOS) oxide, phosphosilicate glass (PSG), boro-phosphosilicate glass (BPSG), Black Diamond® (Applied Materials of Santa Clara, Calif.), amorphous fluorinated carbon, low-k dielectric material, the like or combinations thereof. The conductive features 104a, 104b, 106v, 112a, and 112b may be made of aluminum, aluminum alloy, copper, copper alloy, titanium, titanium nitride, tantalum, tantalum nitride, tungsten, cobalt, the like, and/or combinations thereof. Formation of the interconnect layers may include depositing the ILD layer, etching via and/or trench openings in the ILD layers, filling the via and/or trench openings with the conductive material, and planarizing the conductive material and the ILD layers.

In some embodiments, the conductive features 104a and 104b embedded in ILD layer D1 may be conductive lines. In some embodiments, the conductive features 106v embedded in ILD layer D2 may be conductive vias. In the present embodiments, the conductive features 112a and 112b embedded in ILD layer 114 are conductive pads and lines over and in contact with conductive vias 106v. The conductive features 112a and 112b may be referred to as a conductive pad 112a and a conductive line 112b, respectively. The conductive pad 112a and the conductive line 112b are embedded in the ILD layer 114 and laterally aligned with each other. In some other embodiments, the conductive features 112a and 112b embedded in ILD layer 114 may be conductive vias. In some embodiments, the widths of conductive features 104a, 104b, 112a and 112b may be different. For example, the widths of conductive features 104a and 104b may be greater than that of the conductive features 112a and 112b.

The substrate 102 may also include active and passive devices, for example, underlying the interconnect layers 104, 106, and 110. These further components are omitted from the figures for clarity. In the present embodiments, the substrate 102 has a logic region LR where logic devices or passive devices are to be formed, and a memory region MR where memory cells are to be formed. The conductive pad 112a and the conductive line 112b are respectively in the memory region MR and the logic region LR. The ILD layer 114 may have a portion 114a in the memory region MR and a portion 114b in the logic region LR.

A dielectric layer 120 may be formed on the interconnect layer 110. The dielectric layer 120 may be silicon carbide, silicon oxynitride, silicon nitride, carbon doped silicon nitride or carbon doped silicon oxide. The dielectric layer 120 may include one or plural layers. In some embodiments, a material of the dielectric layer 120 is different from that of the ILD layer 114. The dielectric layer 120 is deposited over the interconnect layer 110 using a chemical vapor deposition (CVD) process such as plasma enhanced (PE) CVD, high-density plasma (HDP) CVD, inductively-coupled-plasma (ICP) CVD, or thermal CVD.

In some embodiments, a patterned resist mask PM1 is formed over a portion of the dielectric layer 120 over the logic region LR, and leaves another portion of the dielectric layer 120 over the memory region MR be exposed. In some embodiments, the patterned resist mask PM is a photoresist. In some embodiments, the patterned resist mask PM is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, pattern exposure, post-exposure baking, developing the photoresist, rinsing, drying (e.g., hard baking), other suitable processes, or combinations thereof. In some embodiments of the present disclosure, since the memory region MR and the logic region LR is quite large, the patterned resist mask PM1 is not required to be formed accurately, such that the patterned resist mask PM1 can be a low-graded mask, which in turn will save the cost and increase the throughput.

Figure 2:
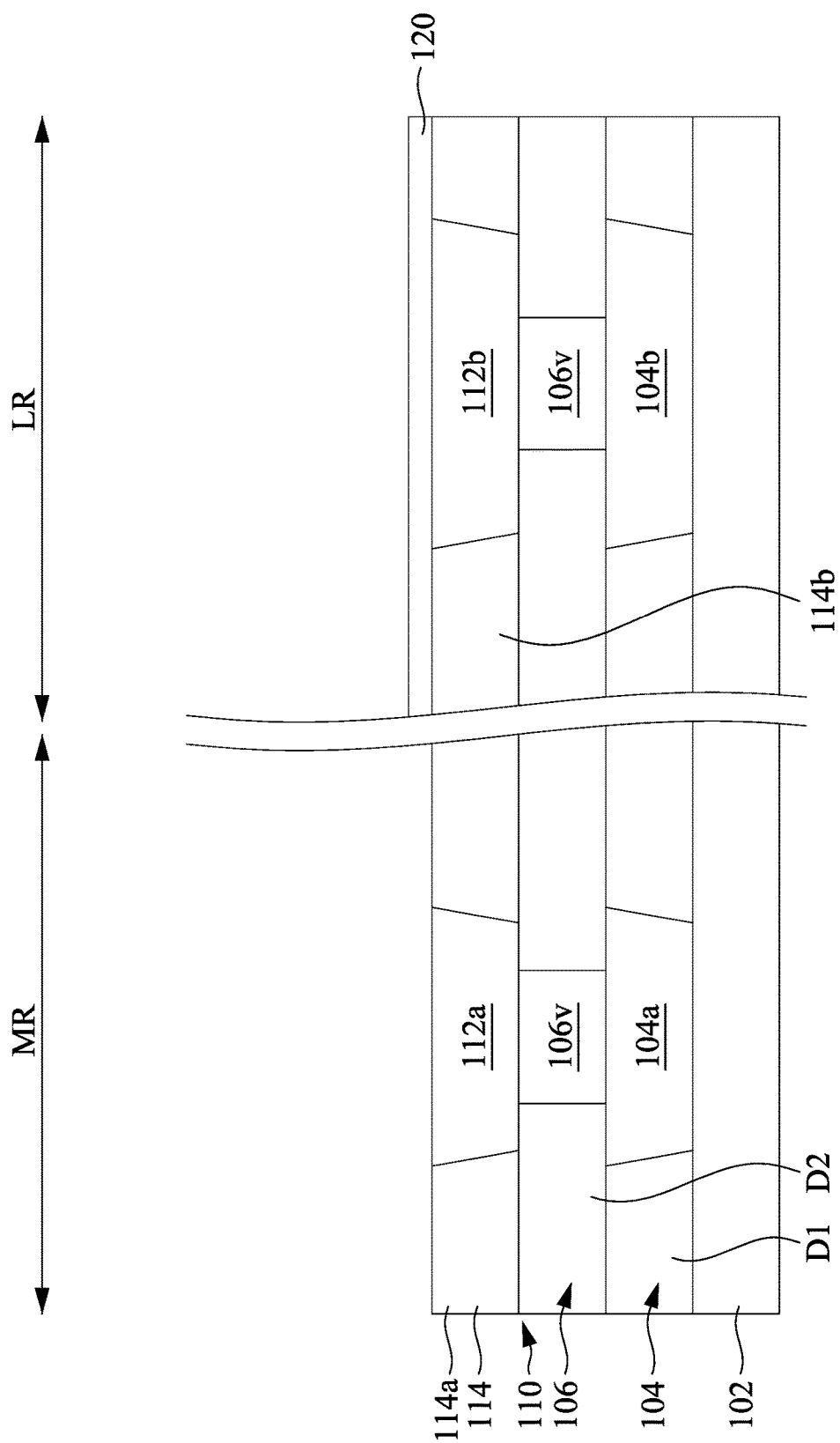

Reference is made to FIG. 2. The dielectric layer 120 is patterned to expose a portion of interconnect layer 110 in the memory region MR. In some embodiments, the dielectric layer 120 is patterned using suitable etching process, and the patterned resist mask PM is used as an etch mask to protect desired portions of the dielectric layer 120. For example, an etchant used to pattern the dielectric layer 120 includes an etching chemistry including gases of $CF_4$, $CH_2F_2$ and/or other chemicals. Through the patterning process, a portion of the dielectric layer 120 over the conductive pad 112a and the portion 114a of the ILD layer 114 in the memory region MR (referring to FIG. 1) is etched and removed, and another portion of the dielectric layer 120 remains over the conductive line 112b and the portion 114b of the ILD layer 114. Through the process, the dielectric layer 120 exposes a top surface of the conductive pad 112a and a top surface of the portion 114a of the ILD layer 114 in the memory region MR. In some embodiments, the patterned resist mask PM1 is removed by suitable ash process after the patterning process. In some embodiments, the patterned resist mask PM1 can be removed by adding oxygen to the etchant.

In some embodiments, an etch rate to the ILD layer 114 is greater than an etch rate to the conductive pad 112a in the etching process for patterning the dielectric layer 120. Due to the etch selectivity between the ILD layer 114 and the conductive pad 112a, a top surface of a portion 114a of the ILD layer 114 in the memory region MR may be lower than that of the conductive pad 112a and another portion 114b of the ILD layer 114 in the logic region LR. In other words, the etching process may consume a part of the portion 114a of the ILD layer 114 of the interconnect layer 110 in the memory region MR.

Figure 3:
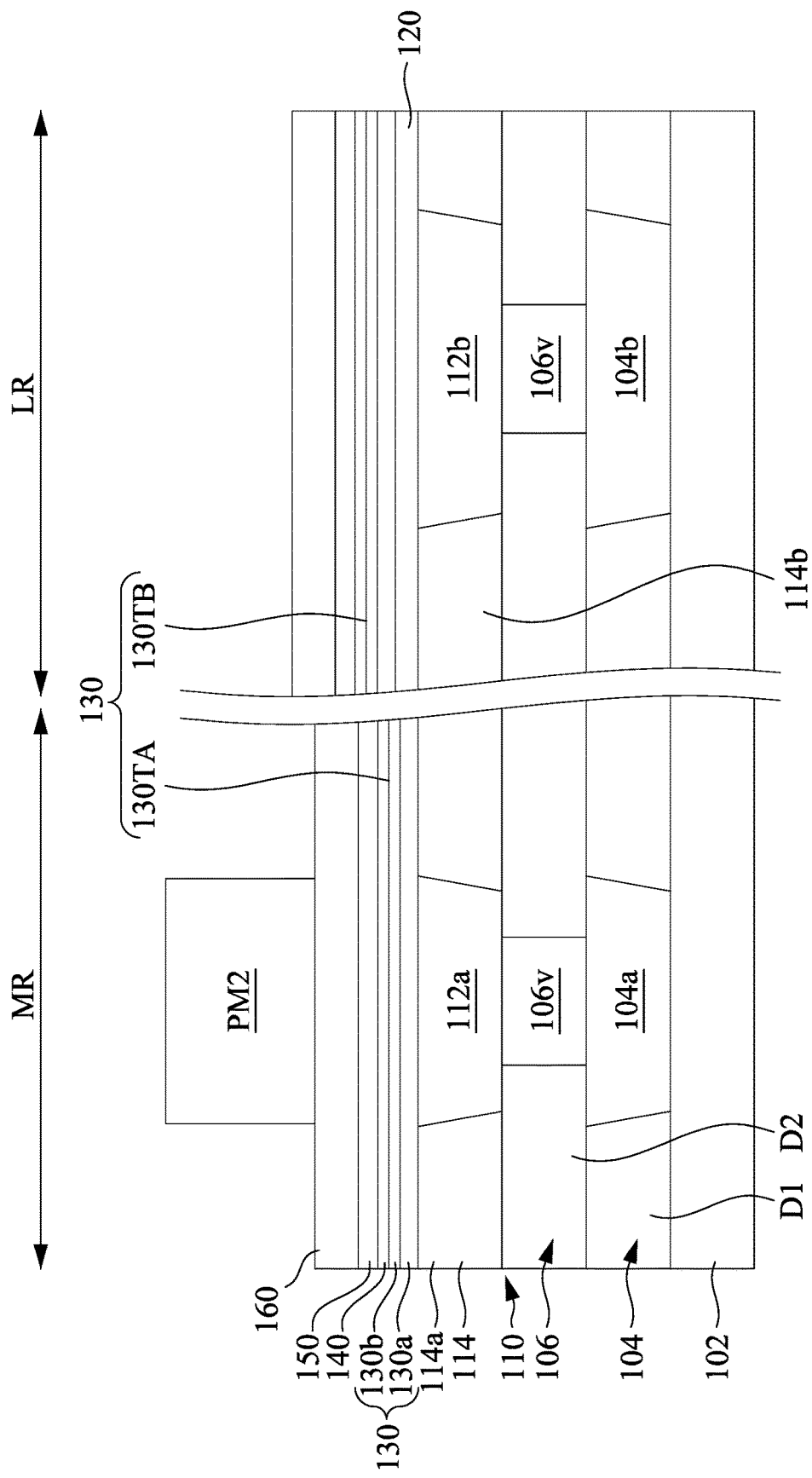

Reference is made to FIG. 3. A plurality of memory layers are formed over the interconnect layer 110 and the dielectric layer 120 in a sequence. For example, the memory layers may include a bottom electrode stack layer 130, a resistance switching layer 140, a capping layer 150, and a top electrode layer 160 formed in a sequence. In some embodiments, a bottommost layer of the memory layers (e.g., the bottom electrode stack layer 130 in the present embodiments) is in contact with the dielectric layer 120, the conductive pad 112a, and the portion 114a of the ILD layer 114. In some other embodiments, the bottom electrode stack layer 130 may be omitted, and the bottommost layer of the memory layers (e.g., the resistance switching layer 140 in the embodiments) is in contact with the dielectric layer 120, the conductive pad 112a, and the portion 114a of the ILD layer 114.

The bottom electrode stack layer 130 may be deposited over the dielectric layer 120, the conductive pad 112a, and the portion 114a of the ILD layer 114. In the present embodiments, the bottom electrode stack layer 130 is in contact with a top surface of the conductive pad 112a and the portion 114a of the ILD layer 114 in the memory region MR. The bottom electrode stack layer 130 can be a single-layered structure or a multi-layered structure. For example, the bottom electrode stack layer 130 includes a barrier layer 130a and a bottom electrode layer 130b over the barrier layer 130a. In some embodiments, the barrier layer 130a may include titanium (Ti), tantalum (Ta), platinum (Pt), ruthenium (Ru), tungsten (W), aluminum (Al), copper (Cu), TiN, TaN, RuO, TaON, TiON, WO, the like, and/or a combination thereof. Formation of the barrier layer 130a may be exemplarily performed using CVD, PVD, ALD, the like, and/or a combination thereof. In some embodiments, the bottom electrode layer 130b is deposited on the barrier layer 130a. The bottom electrode layer 130b may be formed of conductive materials, such as copper, aluminum, tantalum, tungsten, tantalum nitride (TaN), titanium, titanium nitride (TiN), the like, and/or a combination thereof. For example, the bottom electrode layer 130b may include a titanium nitride layer. The bottom electrode layer 130b can be formed using suitable deposition techniques, such as CVD, PVD, ALD, the like, and/or combinations thereof. In the context, the bottom electrode stack layer 130 may also be referred to as a bottom electrode layer.

In some embodiments, a top surface 130T of the bottom electrode stack layer 130 has a first portion 130TA in the memory region MR and a second portion 130TB in the logic region LR. For example, the first portion 130TA of the top surface 130T of the bottom electrode stack layer 130 is over the conductive pad 112a, and the second portion 130TB of the top surface 130T of the bottom electrode stack layer 130 is a second portion 130TB over the conductive line 112b. Due to the presence of the dielectric layer 120, the first portion 130TA of the top surface 130T of the bottom electrode stack layer 130 may be lower than the second portion 130TB of the top surface 130T of the bottom electrode stack layer 130.

In some embodiments, the resistance switching layer 140 is deposited over the bottom electrode stack layer 130 and in direct contact with the bottom electrode stack layer 130. The resistance switching layer 140 may include a RRAM dielectric layer (e.g., metal oxides, such as one or more oxides of W, Ta, Ti, Ni, Co, Hf, Ru, Zr, Zn, Fe, Sn, Al, Cu, Ag, Mo, Cr) as in its relative high resistance state and a metal (e.g., titanium (Ti), hafnium (Hf), platinum (Pt), ruthenium (Ru), and/or aluminum (Al)) as in its relative low resistance state. In some cases, silicon may be included to form a composite material. The resistance switching layer 140 may be formed by a suitable technique, such as atomic layer deposition (ALD) with a precursor containing a metal and oxygen. Other chemical vapor deposition (CVD) techniques may be used. In another example, the resistance switching layer 140 may be formed by a physical vapor deposition (PVD), such as a sputtering process with a metallic target and with a gas supply of oxygen and optionally nitrogen to the PVD chamber. In yet another example, the resistive material layer 320 may be formed an electron-beam deposition process.

Depending on the method of deposition, the oxygen to metal ratio and other process conditions may be tuned to achieve specific resistance switching layer 140 properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

In some embodiments, the capping layer 150 is optionally formed over the resistive material layer 320. The capping layer 150 may be is a metal, for example, titanium, hafnium, platinum, ruthenium or tantalum. In some embodiments, the capping layer 150 may include hafnium oxide, aluminum oxide, tantalum oxides, other metal oxidation composite films, or the combination thereof. The capping layer 150 may be deposited using PVD, CVD, or ALD process.

In some embodiments, the top electrode layer 160 is deposited over the resistance switching layer 140. The top electrode layer 160 may be formed of conductive materials, such as copper, aluminum, tantalum, tungsten, tantalum nitride (TaN), titanium, titanium nitride (TiN), the like, and/or a combination thereof. The top electrode layer 160 may be a single-layered structure or a multilayered structure. The top electrode layer 160 can be formed using suitable deposition techniques, such as CVD, PVD, ALD, the like, and/or combinations thereof.

Still Reference is made to FIG. 3. A resist layer is formed over the top electrode layer 160, and then patterned into a patterned resist mask PM2 using a suitable photolithography process over the memory region MR, such that portions of the top electrode layer 160 are exposed by the patterned resist mask PM2. The patterned resist mask PM2 defines the positions of memory stacks. In some embodiments, the patterned resist mask PM2 is a photoresist. In some embodiments, the patterned resist mask PM2 is an ashing removable dielectric (ARD), which is a photoresist-like material having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 4:
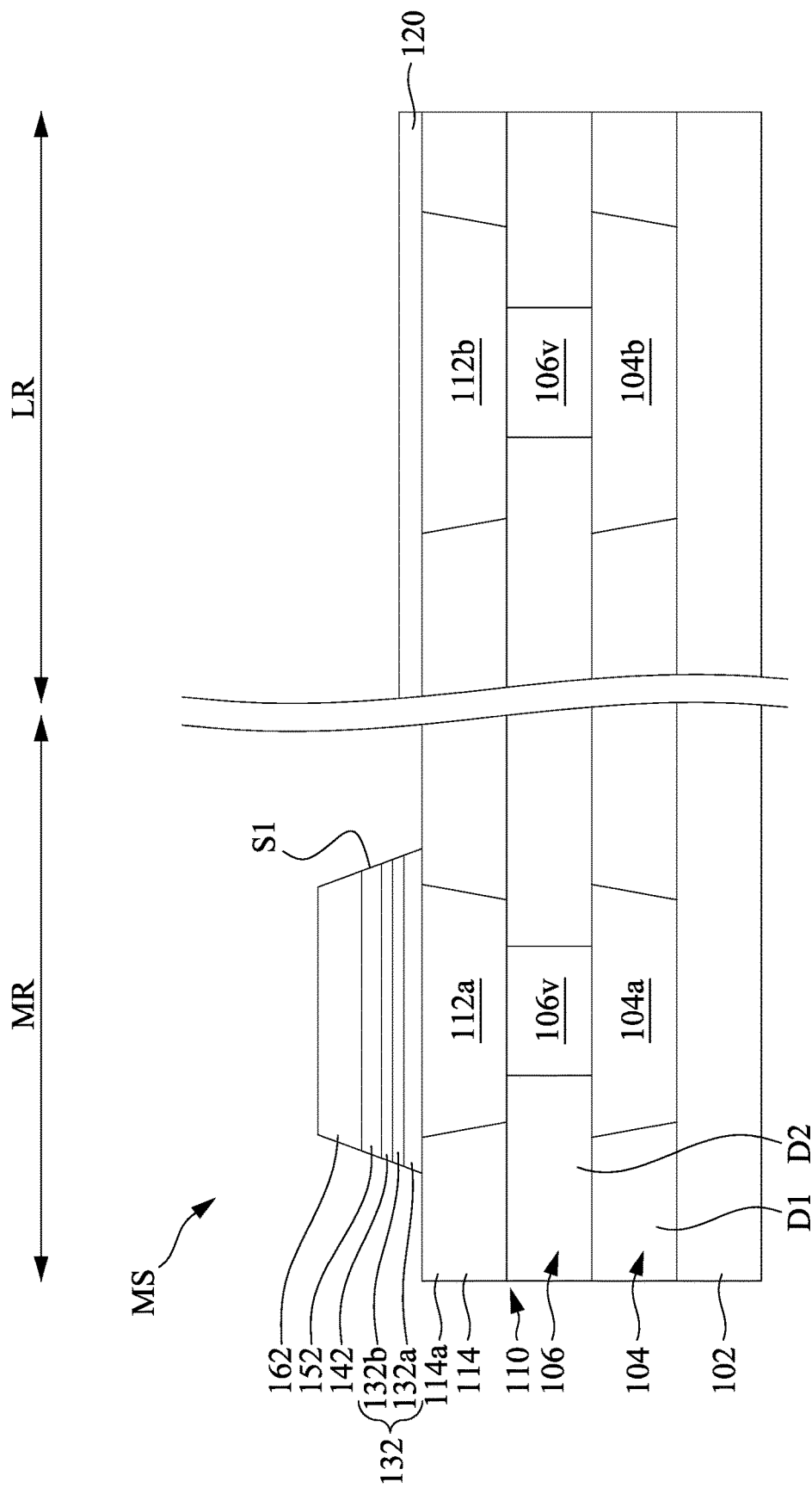

Reference is made to FIG. 4. The top electrode layer 160, the capping layer 150, and the resistance switching layer 140, and the bottom electrode stack layer 130 (referring to FIG. 3) are patterned into at least one a top electrode 162, at least one a capping layer 152, at least one a resistive switching element 142, and at least one bottom electrode 132, respectively. The patterning process may include an etching process using the patterned resist mask PM2 (referring to FIG. 3) as an etch mask. For example, the etching process may be a dry etching process.

In some embodiments, the etching process may use etchants or etching chemistry with suitable recipes to etch the layers 130-160 (referring to FIG. 3). For example, the etching process may use a first etching chemistry to etch the top electrode layer 160 and the capping layer 150 (referring to FIG. 3), use a second etching chemistry to etch the resistance switching layer 140 (referring to FIG. 3), and use a third etching chemistry including to etch the bottom electrode stack layer 130 (referring to FIG. 3). The first to third etching chemistries may include different recipes of gases of Cl-based gas (e.g., $CF_4$), F-based gas ($CH_2F_2$), and/or other chemicals. The etching process removes portions of the top electrode layer 160, the underlying capping layer 150, the underlying resistance switching layer 140, the underlying bottom electrode stack layer 130 not protected by the patterned resist mask PM2 (referring to FIG. 3). The etching process stops when the interconnect layer 110 (e.g., the ILD layer 114) is reached. Techniques are available to detect the end of etching when a new material layer is reached so as to reduce the amount of over etching. In some embodiments, the ILD layer 114 may have a higher etch resistance to the etching process that uses the etchant including the third etching chemistry than that of the bottom electrode stack layer 130. For example, an etch rate to the ILD layer 114 is less than an etch rate to the bottom electrode stack layer 130 during the etching process. In some embodiments, the patterned resist mask PM2 is consumed by the etching process or removed using, for example, an ash process, after the etching process.

Through the patterning process, a memory structure MS is formed over the conductive pad 112a over the memory region MR. The memory structure MS may include a top electrode 162, a capping layer 152, a resistive switching element 142, and a bottom electrode 132. The bottom electrode 132 is over and in contact with the conductive pad 112a. In some embodiments, a bottom surface of the bottom electrode 132 may extend beyond a sidewall of the conductive pad 112a, and therefore be in contact with the ILD layer 114. The bottom electrode 132 may include a barrier layer 132a and a bottom electrode layer 132b. In some embodiments, the resistance switching element 142 is over the bottom electrode 132. In some embodiments, the capping layer 152 is over the resistance switching element 142. In some embodiments, the top electrode 162 is over the capping layer 152. The bottom electrode 132, the resistive switching element 142, the capping layer 152, and the top electrode 162 of the memory structure MS may be free of contacting with the dielectric layer 120.

In some embodiments of the present embodiments, sine the memory structure MS is formed by cutting (e.g., etching) the layers 130-160 (referring to FIG. 3) using one single mask PM2 (referring to FIG. 3), the memory structure MS may taper upward. For example, the memory structure MS have a sidewall S1 inclined with a top surface of the substrate.

Figure 5A:
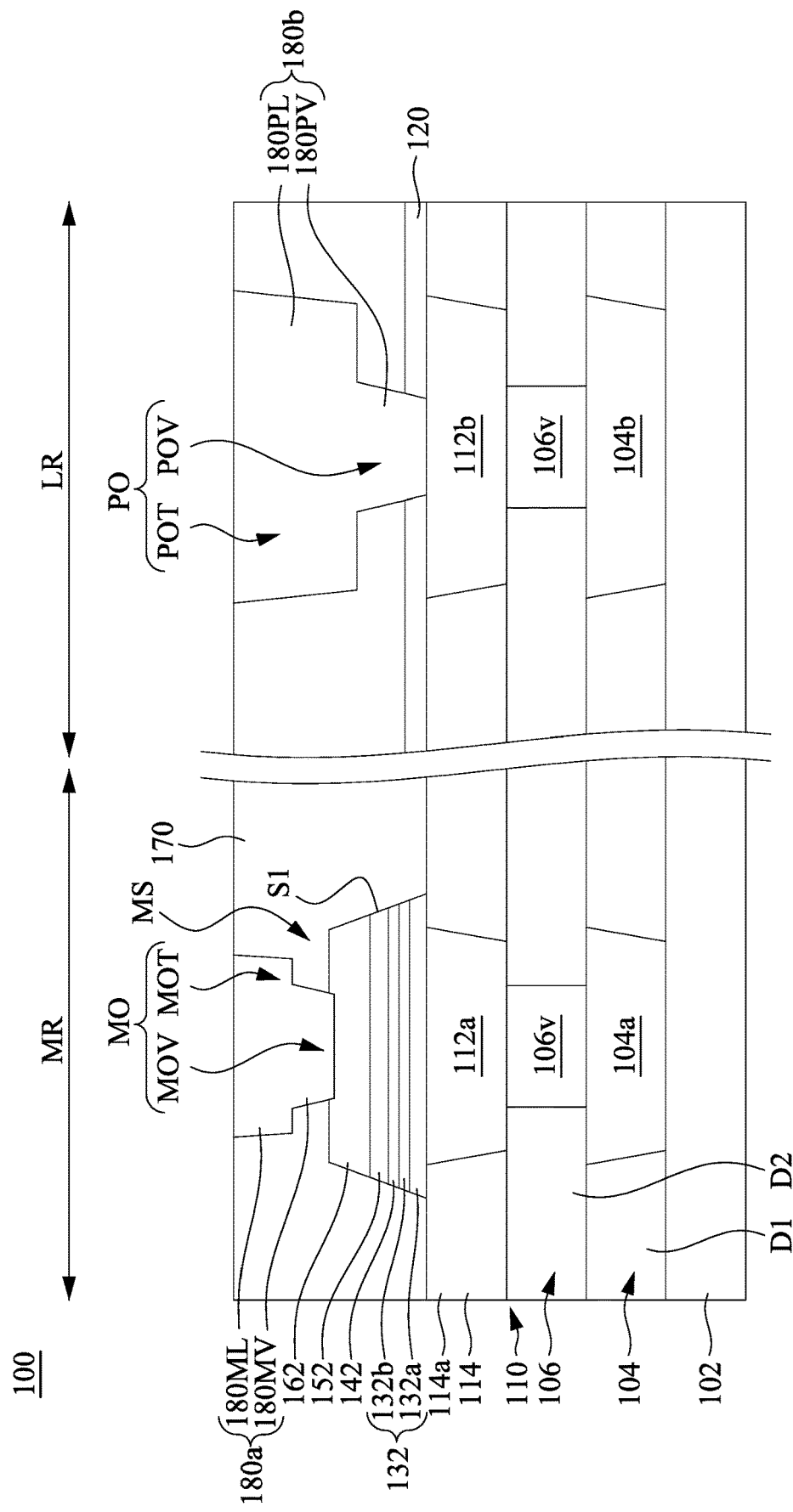

Reference is made to FIG. 5A. An ILD layer 170 is deposited over the memory structure MS, the interconnect layer 110, and the dielectric layer 120 using suitable deposition techniques. The ILD layer 170 may be silicon oxide, extreme or extra low-k silicon oxide such as a porous silicon oxide layer. For example, the ILD layer 170 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

After the formation of the ILD layer 170, a top electrode opening MO is formed in the ILD layer 170, and an interconnect opening PO is formed in the ILD layer 170 and the dielectric layer 120. The top electrode opening MO may expose the top electrode 162 of the memory structure MS. The interconnect opening PO may expose the conductive line 112b.

In some embodiments, formation of the top electrode opening MO and the interconnect opening PO may include a via etching process, a trench etching process, and a liner removal process. The via etching process may be performed to etch a vias opening MOV in the ILD layer 170 in the memory region MR and etch a via opening POV in the ILD layer 170 and dielectric layer 120 in the logic region LR. The trench etching process may be performed to etch a trench opening MOT in the ILD layer 170 in the memory region MR, etch a trench opening POT in the ILD layer 170 in the logic region LR. The via etching process and the trench etching process may include suitable anisotropic etching processes. In some embodiments where the ILD layer 170 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. Sometimes, the trench etching process may deepen the via openings MOV and POV after the via etching process. Alternative, in some other embodiments, the trench etching process may be performed prior to the via etching process. In some embodiments, in the logic region LR, the dielectric layer 120 may have a higher etch resistance to the via and trench etching processes than that of the ILD layer 170 and the ILD layer 114, such that the via and trench etching processes may stop at the dielectric layer 120. The dielectric layer 120 may be referred to as an etch stop layer in some embodiments.

After the trench etching process and the via etching process, the liner removal process may be performed to remove a portion of the dielectric layer 120 exposed by the via opening POV, such that the via opening POV may expose the underlying conductive line 112b. The liner removal process may include one or more isotropic etching processes, such as dry etching processes using $CH_2F_2$ and Ar as etching gases. In some embodiments, the conductive line 112b may have a higher etch resistance to the liner removal process than that of the dielectric layer 120, such that the liner removal process may stop at the conductive line 112b and not damage the underlying layers. The liner removal process may also slope the sidewalls of the via openings MOV and POV.

Through these etching processes, the interconnect opening PO may be a combination of the via opening POV and the trench opening POT. Through these etching processes, the top electrode opening MO may be a via opening MOV, a trench opening MOT, or the combination thereof. In some other embodiments, the vias openings MOV may be omitted, and the via etching process may etch via openings 210LV and not etch vias openings MOV in the ILD layer 200. The trench etching process may be performed to etch the trenches MOT to expose the top electrode 162 without the via etching process.

After the formation of the top electrode opening MO and the interconnect opening PO, the top electrode opening MO and the interconnect opening PO are filled with a conductive material. The conductive material may include a metal conductor, such as aluminum, aluminum alloy, copper, copper alloy, titanium, titanium nitride, tantalum, tantalum nitride, tungsten, cobalt, the like, and/or combinations thereof. The metal conductor may be deposited using PVD or one of the plating methods, such as electrochemical plating. The conductive material may also include one or more liner and barrier layers in additional a metal conductor. The liner and/or barrier may be conductive and deposited using CVD or PVD. After filling the conductive material, a planarization process, such as chemical mechanical polishing (CMP), is performed to remove excess conductive material out of the top electrode opening MO and the interconnect opening PO.

Through the process, a conductive feature 180a is formed in the top electrode opening MO in the memory region MR and in contact with the top electrode 162, and a conductive feature 180b is formed in the interconnect opening PO in the logic region LR and in contact with the conductive line 112b. In the present embodiments, the conductive feature 180a includes a conductive line 180ML in the trench opening MOT and a conductive via 180MV in the via opening MOV. In some embodiments, the conductive via 180MV may be omitted. In the present embodiments, the conductive feature 180b includes a conductive line 180PL in the trench opening POT and a conductive via 180PV in the via opening POV.

In some embodiments of the present disclosure, an integrated circuit device 100 including the memory structure MS can be fabricated using a low-grade mask (e.g., the patterned resist mask PM1 in FIG. 1) and a high-grade mask (e.g., the patterned resist mask PM2 in FIG. 3), thereby saving the cost and simplifying the process, which in turn will increase the throughput. Features patterned using the low-grade mask may have a critical dimension greater than a critical dimension of features patterned using the high-grade mask. For example, herein, a width of an intact portion of the low-grade mask (e.g., the patterned resist mask PM1 in FIG. 1) is greater than a width of an intact portion of the high-grade mask (e.g., the patterned resist mask PM2 in FIG. 3). In some embodiments of the present disclosure, the memory structure MS may be formed by cutting (e.g., etching) the layers 130-160 (referring to FIG. 3) using one single high-grade mask (e.g., the patterned resist mask PM2 in FIG. 3), and then one clean process is performed after the cutting. Since no clean process is required after etching the top electrode layer 160 (referring to FIG. 3) and prior to etching the resistance switching layer 140 (referring to FIG. 3), the fabrication process is further simplified. Further, since the memory structure MS may be formed without using a spacer around the top electrode 162 to define the bottom electrode, the fabrication process is further simplified. In some embodiments of the present disclosure, by removing the dielectric layer 120 in the memory region MR, the cell step height is reduced, which is beneficial for integrating the memory structure MS into the multi-level interconnect.

Figure 5B:
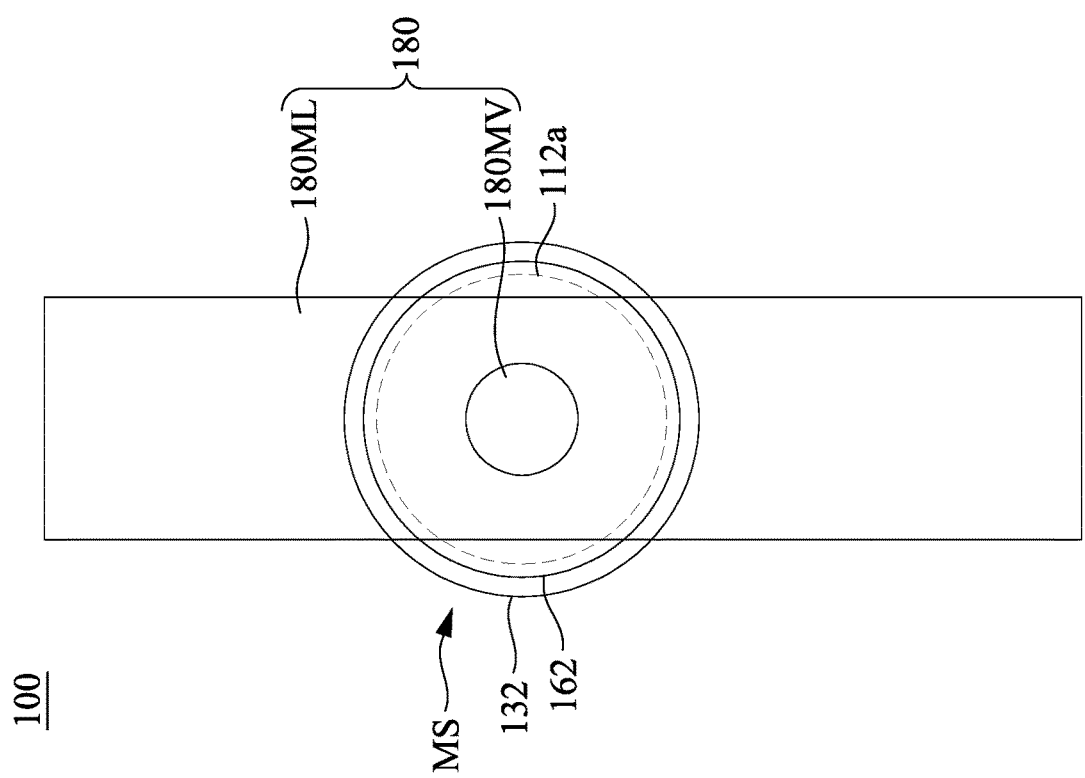

Reference is made to FIG. 5B. FIG. 5B is a schematic top view of the integrated circuit device 100 of FIG. 5A over the memory region MR. As shown in the figure, the bottom electrode 132 of the memory structure MS extends beyond a sidewall of the conductive pad 112a (indicated by dashed line). In detail, in the present embodiments, a width of the bottom electrode 132 may be greater than a width of the conductive pad 112a and a width of the conductive line 180ML. The conductive line 180ML may be connected with the top electrode 162 of the memory structure MS through the conductive via 180MV. In the present embodiments, the top electrode 162 of the memory structure MS also extends beyond the sidewall of the conductive pad 112a. In detail, in the present embodiments, a width of the top electrode 162 may be greater than a width of the conductive pad 112a and a width of the conductive line 180ML. In some other embodiments, the top electrode 162 of the memory structure MS may not extend beyond the sidewall of the conductive pad 112a.

Figure 6:
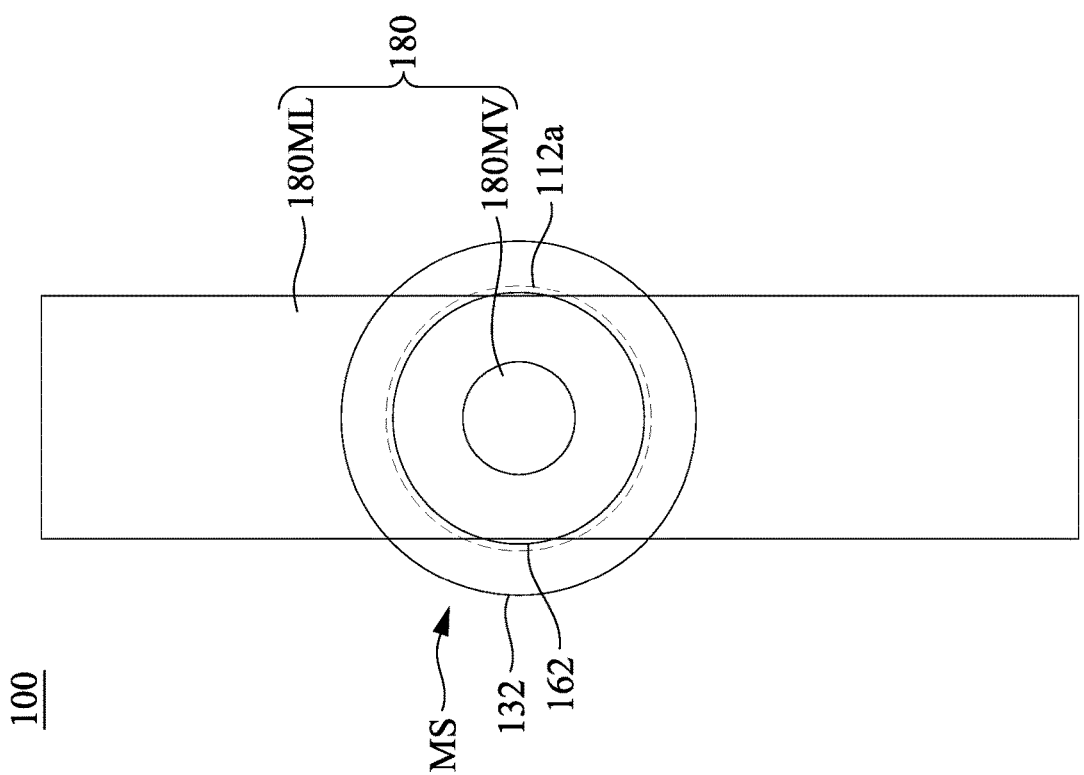
FIG. 6 is a schematic top view of an integrated circuit device in accordance with some embodiments of the present disclosure.

FIG. 6 is a schematic top view of an integrated circuit device 100 in accordance with some embodiments of the present disclosure. The present embodiments are similar to the embodiments of FIGS. 1-5B, except that the top electrode 162 of the memory structure MS does not extend beyond the sidewall of the conductive pad 112a (indicated by dashed line). In detail, in the present embodiments, a width of the top electrode 162 is less than a width of the conductive pad 112a and may be greater than a width of the conductive line 180ML. Other details of the present embodiments are the same as that discussed previously with respect to FIGS. 1-5B, and therefore not repeated for the sake of brevity.

Figure 7:
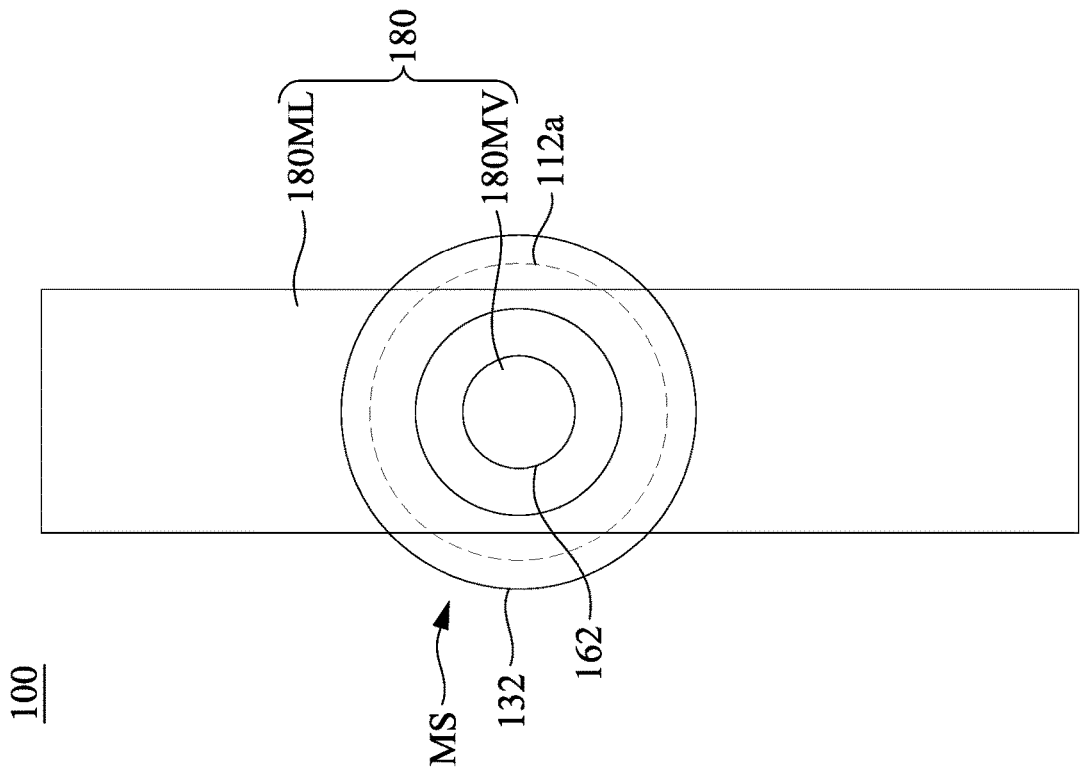
FIG. 7 is a schematic top view of an integrated circuit device in accordance with some embodiments of the present disclosure.

FIG. 7 is a schematic top view of an integrated circuit device 100 in accordance with some embodiments of the present disclosure. The present embodiments are similar to the embodiments of FIG. 6, except that a width of the top electrode 162 is less than a width of the conductive pad 112a and may be less than a width of the conductive line 180ML. Other details of the present embodiments are the same as that discussed previously with respect to FIGS. 1-5B, and therefore not repeated for the sake of brevity.

Figure 8:
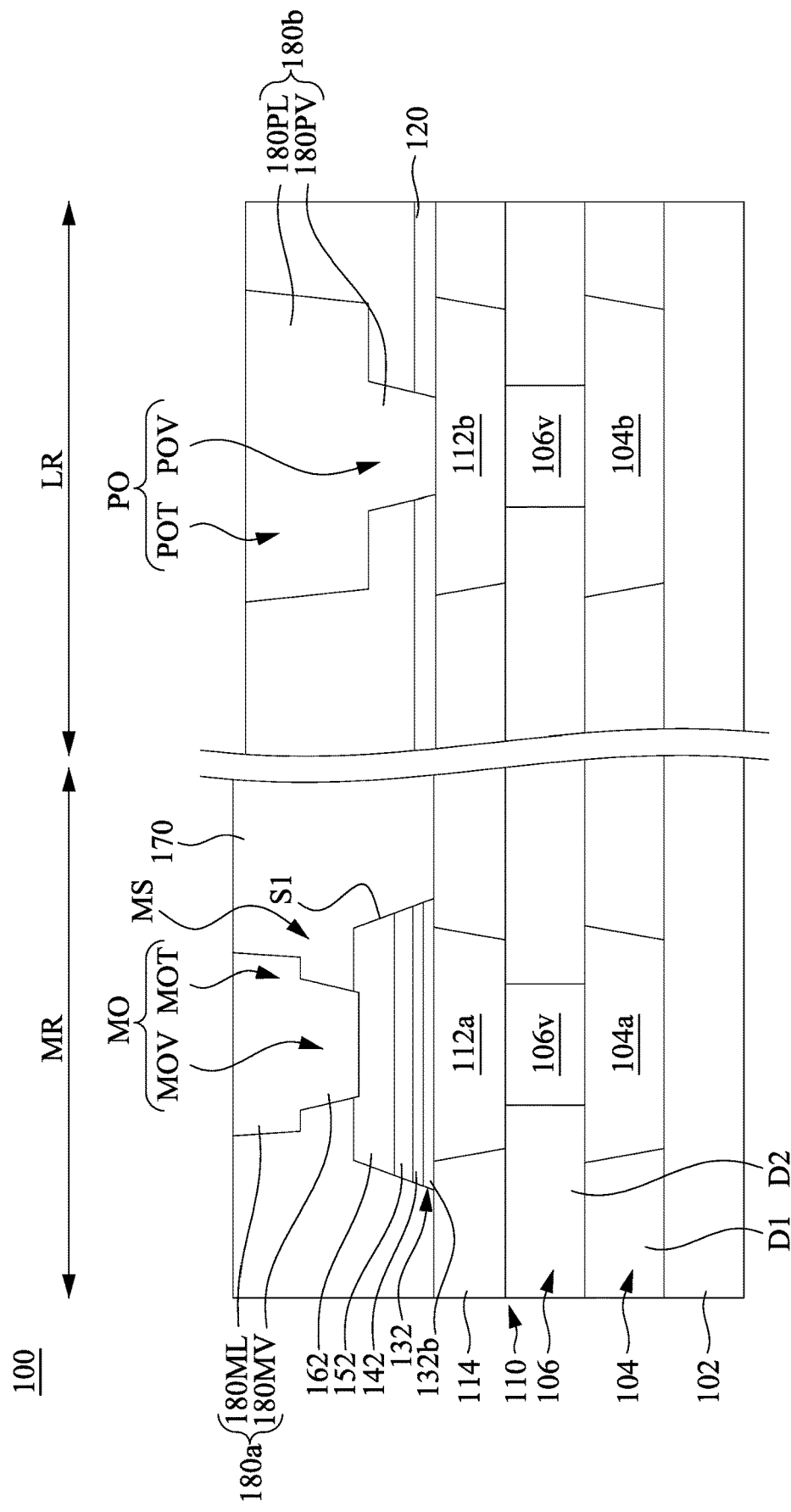
FIG. 8 is a schematic cross-sectional view of an integrated circuit device in accordance with some embodiments of the present disclosure.

FIG. 8 is a schematic cross-sectional view of an integrated circuit device 100 in accordance with some embodiments of the present disclosure. The present embodiments are similar to the embodiments of FIGS. 1-5B, except that the barrier layer 132a is omitted from the memory structure MS, and the bottom electrode layer 132b is in direct contact with the conductive pad 112a and the ILD layer 114. Other details of the present embodiments are the same as that discussed previously with respect to FIGS. 1-5B, and therefore not repeated for the sake of brevity.

Figure 9A:
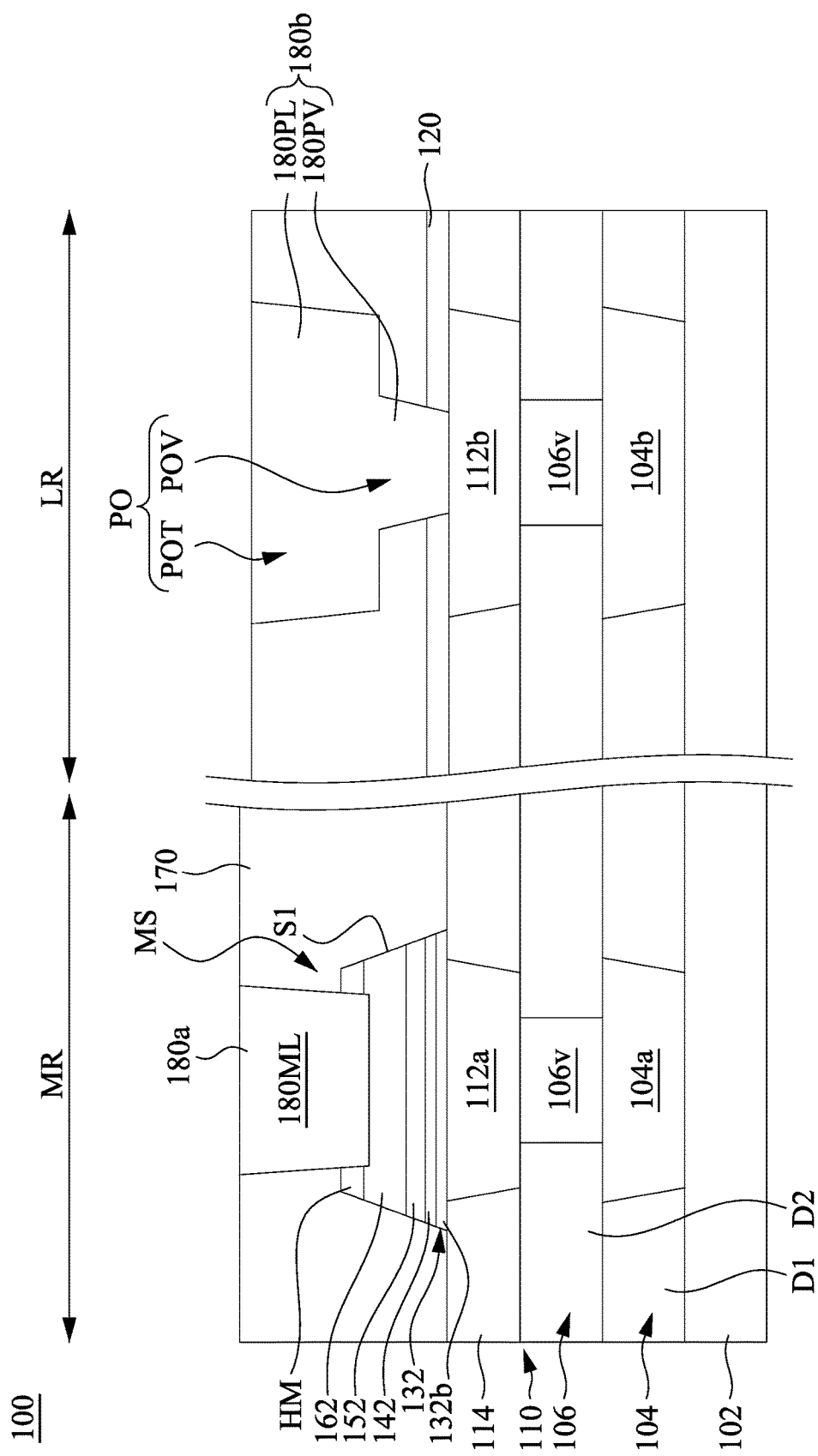
FIG. 9A is a schematic cross-sectional view of an integrated circuit device in accordance with some embodiments of the present disclosure.

FIG. 9A is a schematic cross-sectional view of an integrated circuit device 100 in accordance with some embodiments of the present disclosure. FIG. 9B is a schematic top view of the integrated circuit device 100 of FIG. 9A over the memory region MR. Reference is made to FIGS. 9A and 9B. The present embodiments are similar to the embodiments of FIG. 8, except that a hard mask HM is formed over the memory structure MS. In the present embodiments, a hard mask layer may be formed over the top electrode layer 160 (referring to FIG. 3), and then patterned using the patterned resist mask PM2 as etch mask, thereby forming the hard mask HM. The hard mask HM may include suitable dielectric materials, such as SiON, SiN, SiC, SiCN, SiO$_x$, the like, or the combination thereof. Alternatively, in some other embodiments, the hard mask HM may include conductive materials, such as metal or metal-containing compounds. In the present embodiments, the conductive line 180M may penetrate through the hard mask HM and be in direct contact with the top electrode 162. In some embodiments where the hard mask HM is electrically conductive, the conductive line 180M may not penetrate through the hard mask HM and not be in direct contact with the top electrode 162. Other details of the present embodiments are the same as that discussed previously with respect to FIG. 8, and therefore not repeated for the sake of brevity.

Figure 10:
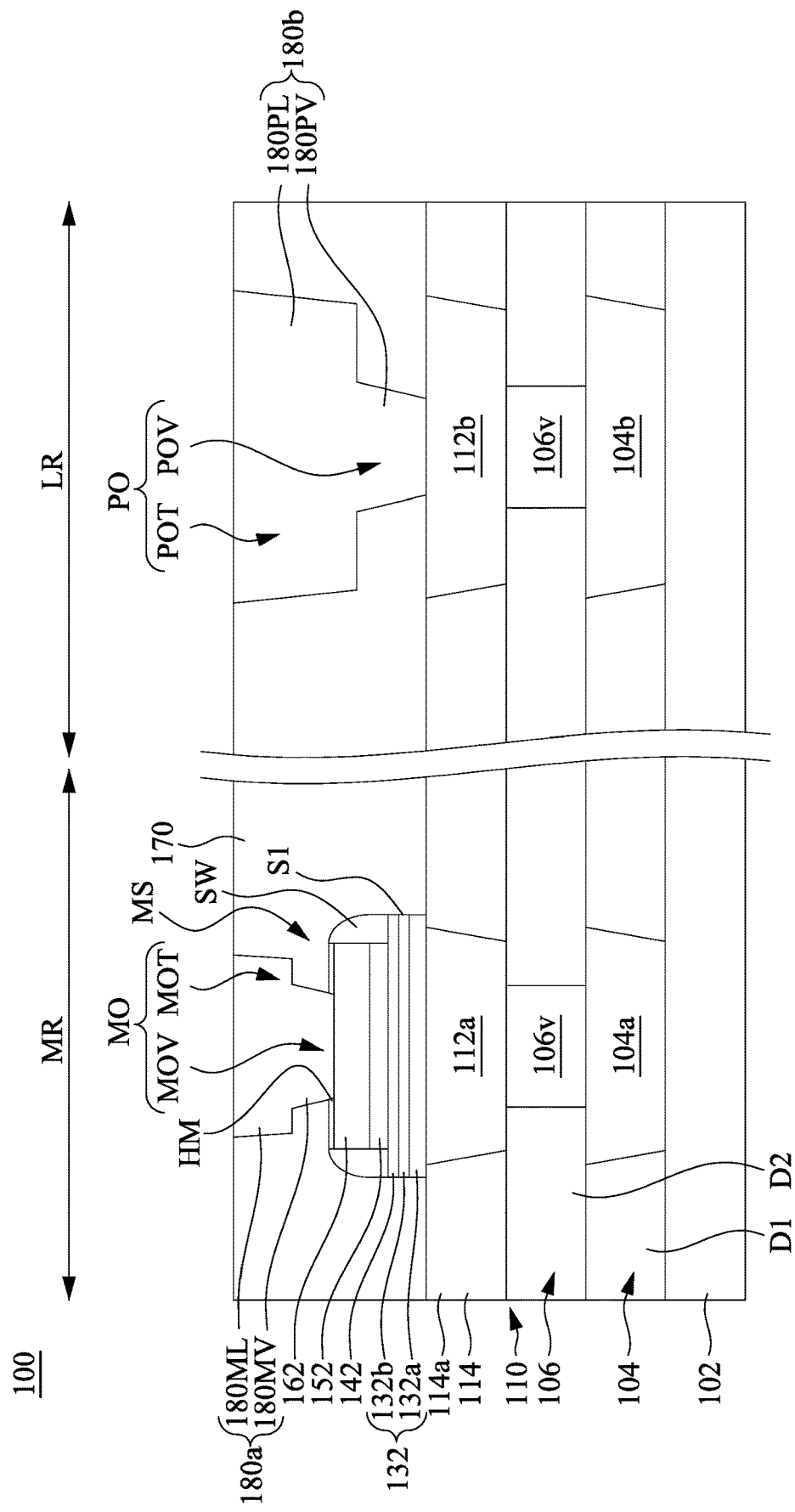
FIG. 10 is a schematic cross-sectional view of an integrated circuit device in accordance with some embodiments of the present disclosure.

FIG. 10 is a schematic cross-sectional view of an integrated circuit device 100 in accordance with some embodiments of the present disclosure. The present embodiments are similar to the embodiments of FIGS. 1-5B, except that the memory structure MS is formed with spacer SW surrounding the capping layer 152, the top electrode 162, and the hard mask HM, thereby defining the underlying bottom electrode 132. In the present embodiments, the hard mask HM is first formed over the top electrode layer 160 (referring to FIG. 3), and then the top electrode layer 160 and the capping layer 150 are respectively patterned into the top electrode 162 and the capping layer 152 by suitable etching process. Subsequently, in the present embodiments, the spacer SW is formed around the hard mask HM, the top electrode 162, and the capping layer 152, and then the resistance switching layer 140 and the bottom electrode layer 130 are patterned, using the spacers and the hard mask HM as mask, into the resistance switching element 142 and the bottom electrode 132, respectively. Other details of the present embodiments are the same as that discussed previously with respect to FIGS. 1-5B, and therefore not repeated for the sake of brevity.

Figure 11:
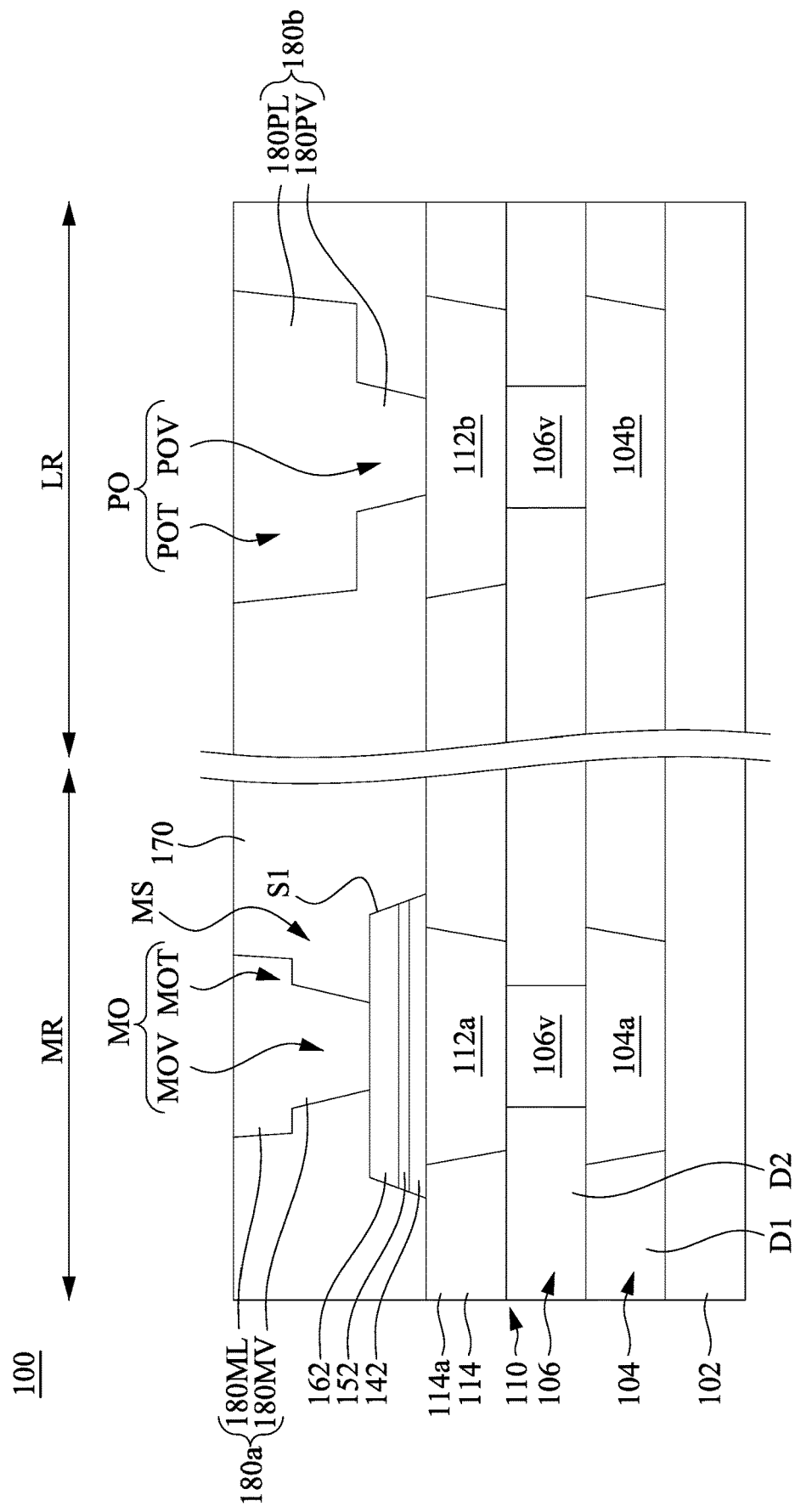
FIG. 11 is a schematic cross-sectional view of an integrated circuit device in accordance with some embodiments of the present disclosure.

FIG. 11 is a schematic cross-sectional view of an integrated circuit device 100 in accordance with some embodiments of the present disclosure. The present embodiments are similar to the embodiments of FIGS. 1-5B, except that the bottom electrode 132 is omitted from the memory structure MS in the present embodiments. For example, the resistance switching element 142 is in contact with a top surface of the conductive pad 112a. In the present embodiments, when depositing the memory layers as illustrated in FIG. 3, the bottom electrode stack layer 130 may be omitted, and the bottommost layer of the memory layers (e.g., the resistance switching layer 140 in the embodiments) is in contact with the dielectric layer 120, the conductive pad 112a, and the portion 114a of the ILD layer 114. In some embodiments, the top electrode 162 may also be omitted from the memory structure MS. Other details of the present embodiments are the same as that discussed previously with respect to FIGS. 1-5B, and therefore not repeated for the sake of brevity.

Figure 12:
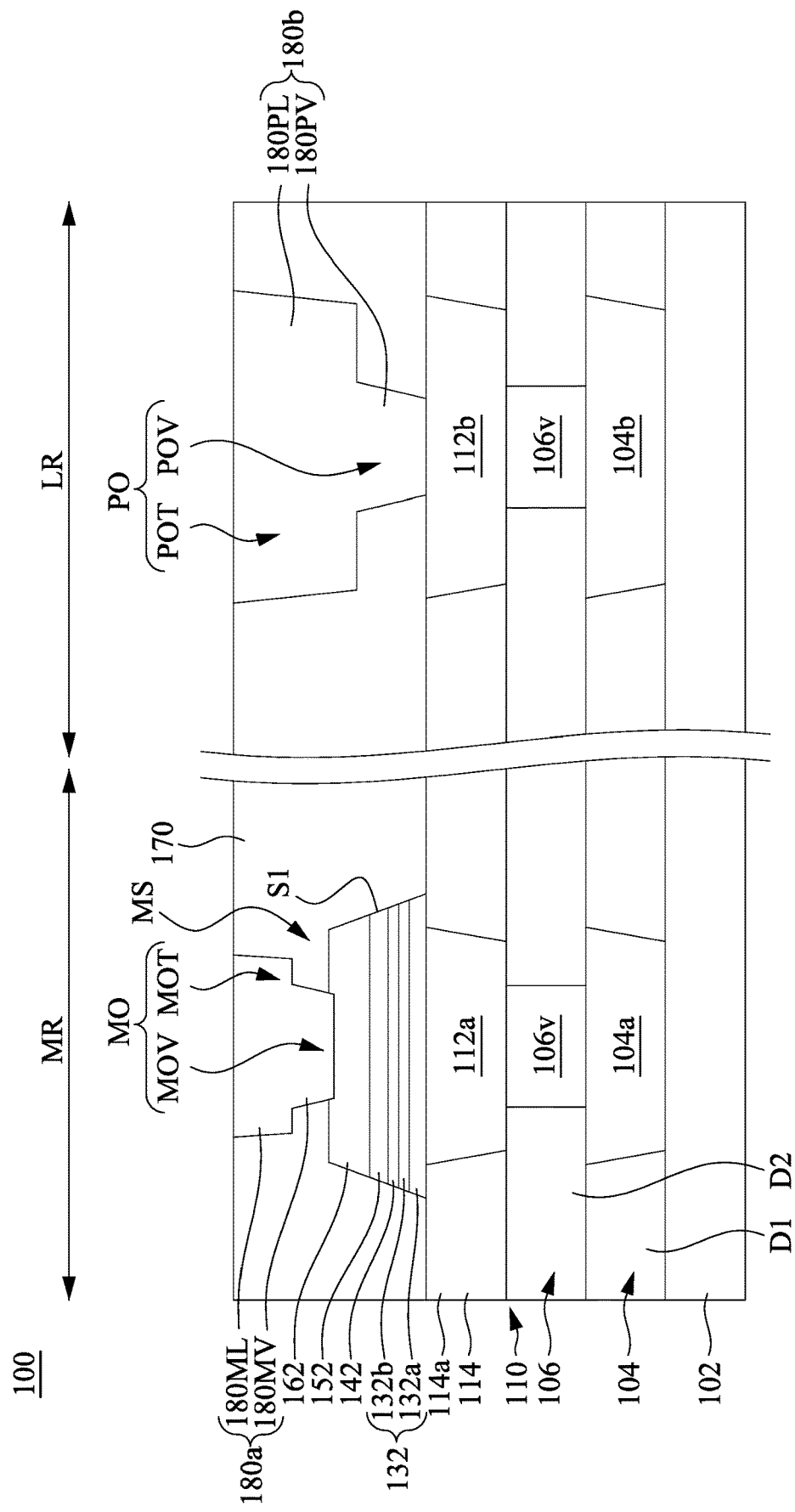
FIG. 12 is a schematic cross-sectional view of an integrated circuit device in accordance with some embodiments of the present disclosure.

FIG. 12 is a schematic cross-sectional view of an integrated circuit device 100 in accordance with some embodiments of the present disclosure. The present embodiments are similar to the embodiments of FIGS. 1-5B, except that the dielectric layer 120 (referring to FIG. 5A) is omitted from the integrated circuit device 100 in the present embodiments. For example, the bottom electrode stack layer 130 (shown in FIG. 3) may be deposited over and in contact with interconnect layer 110 without a dielectric layer 120 (shown in FIG. 3) interposed therebetween. For example, the bottom electrode stack layer 130 (shown in FIG. 3) may be in contact with the conductive pad 112a and the portion 114a in the logic region LR and the conductive line 112b and the portion 114b in the memory region MR. The resistance switching layer 140, the capping layer 150, and the top electrode layer 160 (shown in FIG. 3) may then be deposited over the bottom electrode stack layer 130. Subsequently, as the operation shown in FIG. 4, the layers 130-160 may then be patterned to form the memory structure MS. Other details of the present embodiments are the same as that discussed previously with respect to FIGS. 1-5B, and therefore not repeated for the sake of brevity.

Figure 13:
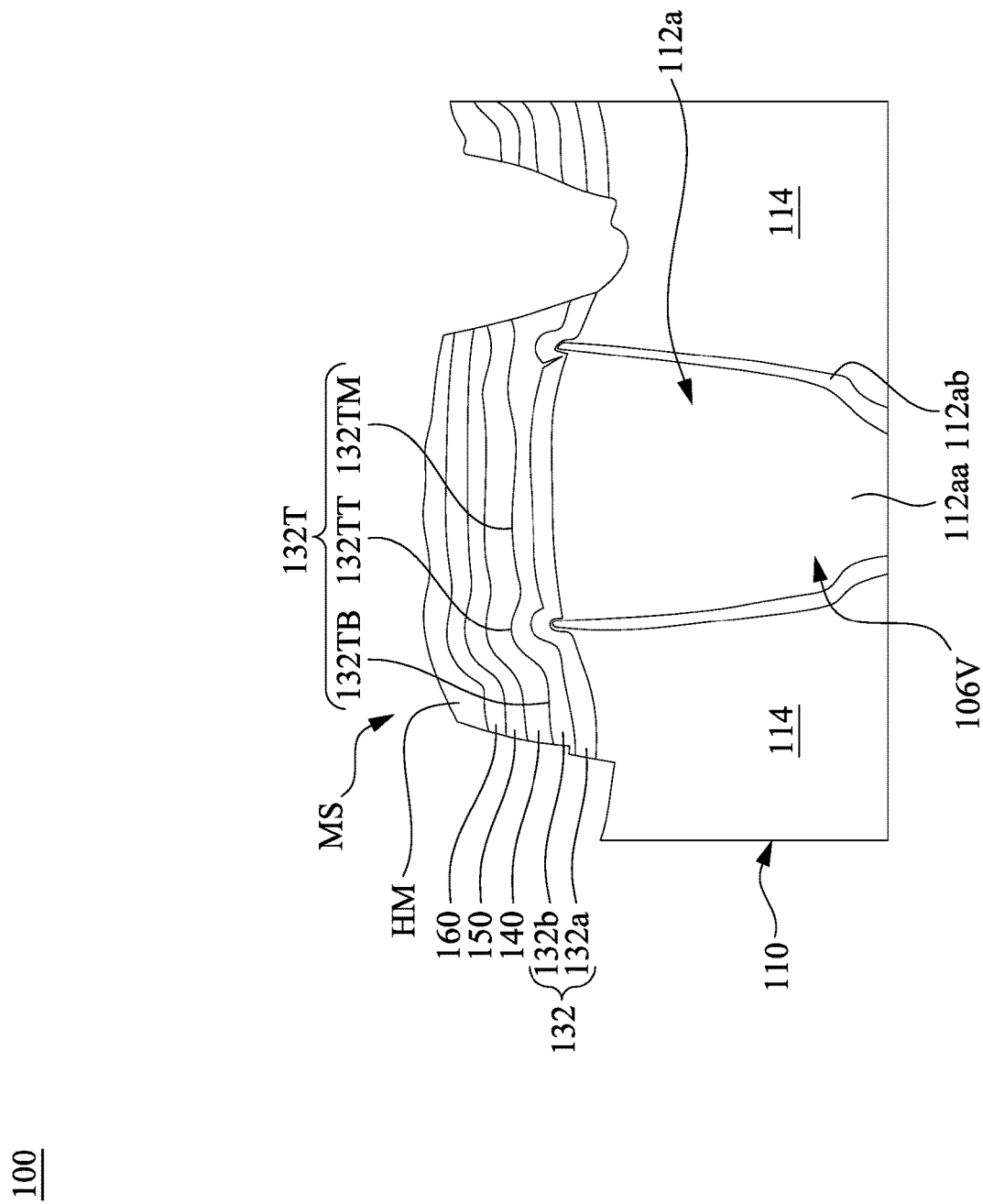
FIG. 13 is a cross-sectional view of an exemplary integrated circuit device in accordance with some embodiments of the present disclosure.

FIG. 13 is a cross-sectional view of an exemplary integrated circuit device in accordance with some embodiments of the present disclosure. The exemplary integrated circuit device shows that the interconnect layer 110 may have a higher top surface at a top of the conductive pad 112a and a lower top surface at a top of the ILD layer 114. The height difference results from the etch selectivity between the conductive pad 112a and the ILD layer 114 during patterning the dielectric layer 120 (referring to FIG. 2). For example, the conductive pad 112a has a higher etch resistance to the etching process that patterns the dielectric layer 120 (referring to FIG. 2) than that of the ILD layer 114. That is, an etch rate to the ILD layer 114 is greater than an etch rate to the conductive pad 112a during the patterning the dielectric layer 120 (referring to FIG. 2). The etching process may consume a part of the portion 114a of the ILD layer 114 of the interconnect layer 110 in the memory region MR and lowering a top surface of the portion 114a of the ILD layer 114.

According the profile of the interconnect layer 110 including the conductive pad 112a and the ILD layer 114, the memory structure MS may have a higher top surface above the conductive pad 112a than a top surface above ILD layer 114. For example, a bottom surface of the bottom electrode 132 may have a bottommost portion at edge, and the bottommost portion of the bottom surface of the bottom electrode 132 is lower than a top surface of the conductive pad 112a.

In the present embodiments, the conductive pad 112a and the conductive via 106v includes a barrier layer 112ab and a conductive filling material 112aa, and a top of the barrier layer 112ab is higher than a top of the conductive filling material 112aa. The height difference between tops of the barrier layer 112ab and the conductive filling material 112aa results from the etch selectivity between the barrier layer 112ab and the conductive filling material 112aa during patterning the dielectric layer 120 (referring to FIG. 2). For example, the barrier layer 112ab has a higher etch resistance to the etching process that patterns the dielectric layer 120 (referring to FIG. 2) than that of the conductive filling material 112aa. That is, an etch rate to the conductive filling material 112aa is greater than an etch rate to the barrier layer 112ab during the patterning the dielectric layer 120 (referring to FIG. 2). The etching process may consume a part of the conductive filling material 112aa and lowering a top surface of the conductive filling material 112aa.

According the profile of the conductive pad 112a including the barrier layer 112ab and the conductive filling material 112aa, the top surface 132T of the bottom electrode 132 may have a topmost portion 132TT over the top of the barrier layer 112ab, a middle portion 132TM over the top of the conductive filling material 112aa, and a bottommost portion 132TB over the ILD layer 114. Other details of the present embodiments are the same as that discussed previously with respect to FIGS. 1-5B, and therefore not repeated for the sake of brevity.

Figure 14:
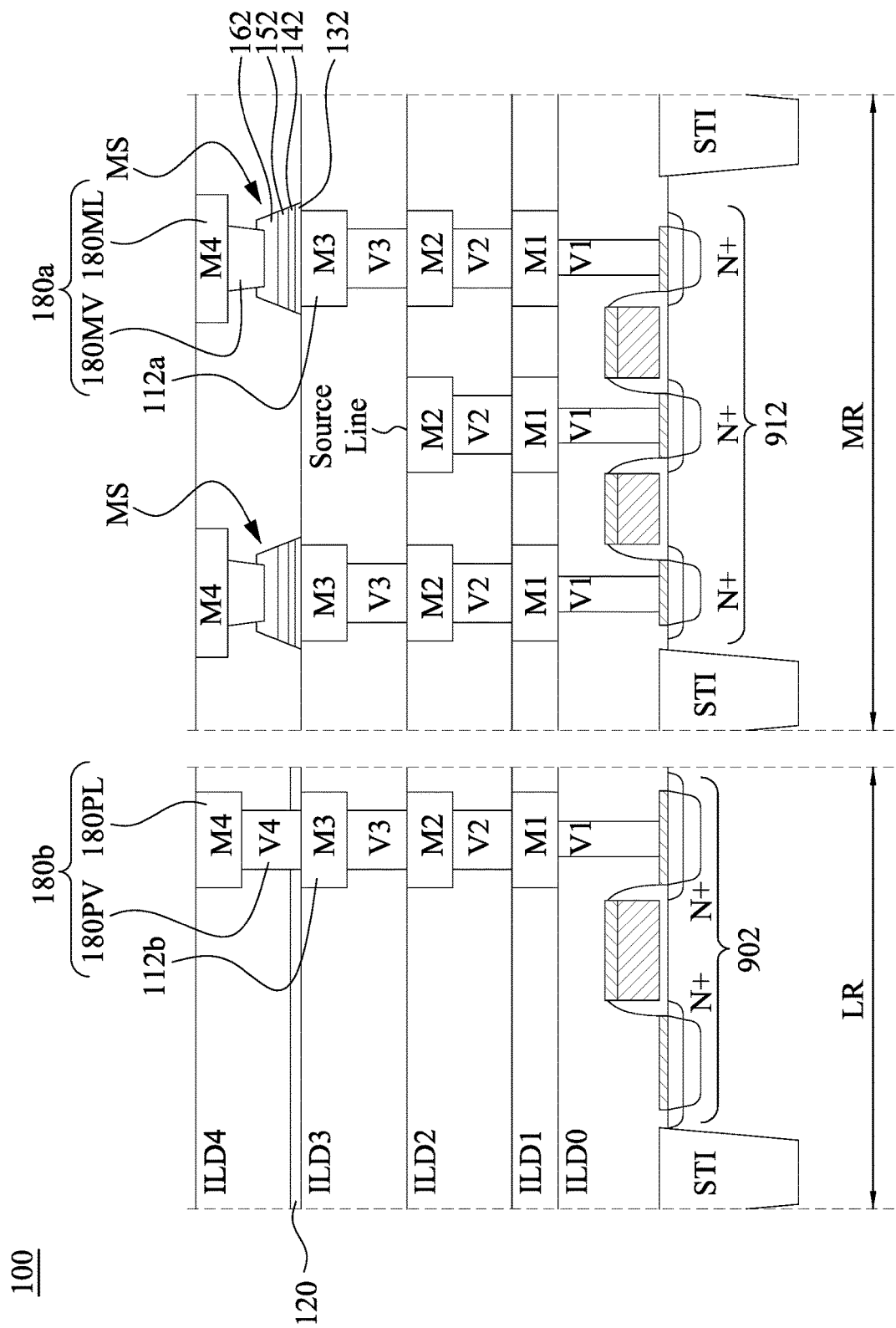
FIG. 14 is a schematic cross-sectional view of an integrated circuit device in accordance with some embodiments of the present disclosure.

FIG. 14 is a schematic cross-sectional view of an integrated circuit device 100 in accordance with some embodiments of the present disclosure. The semiconductor device includes a logic region LR and a memory region MR. Logic region LR may include circuitry, such as an exemplary logic transistor 902, for processing information received from the memory structures MS in the memory region MR and for controlling reading and writing functions of the memory structures MS.

As depicted, the semiconductor device is fabricated using four metallization layers, labeled as M1 through M4, with four layers of metallization vias or interconnects, labeled as V1 through V4. Other embodiments may contain more or fewer metallization layers and a corresponding more or fewer number of vias. Logic region LR includes a full metallization stack, including a portion of each of metallization layers M1-M4 connected by vias V2-V4, with V1 connecting the stack to a source/drain contact of logic transistor 902. The memory region MR includes a full metallization stack connecting memory structures MS to transistors 912 in the memory region MR, and a partial metallization stack connecting a source line to transistors 912 in the memory region MR. Memory structures MS are depicted as being fabricated in between the top of the M3 layer and the bottom of the M4 layer. In some embodiments, the memory structures MS may be similar to those shown above. For example, the M3 layer has conductive pads 112a and a conductive line 112b. The conductive pads 112a and the conductive line 112b are formed over and in contact with the vias V3. Also included in semiconductor device is a plurality of ILD layers. Five ILD layers, identified as ILD0 through ILD4 are depicted in FIG. 14 as spanning the logic region LR and the memory region MR. The ILD layers may provide electrical insulation as well as structural support for the various features of the semiconductor device during many fabrication process steps.

FIGS. 15-18 illustrate various stages in the fabrication process of an integrated circuit device 100 according to some embodiments of the present disclosure. The illustration is merely exemplary and is not intended to limit beyond what is specifically recited in the claims that follow. It is understood that additional operations may be provided before, during, and after the operations shown by FIGS. 15-18, and some of the operations described below can be replaced or eliminated for additional embodiments of the method. The order of the operations/processes may be interchangeable.

Figure 15:
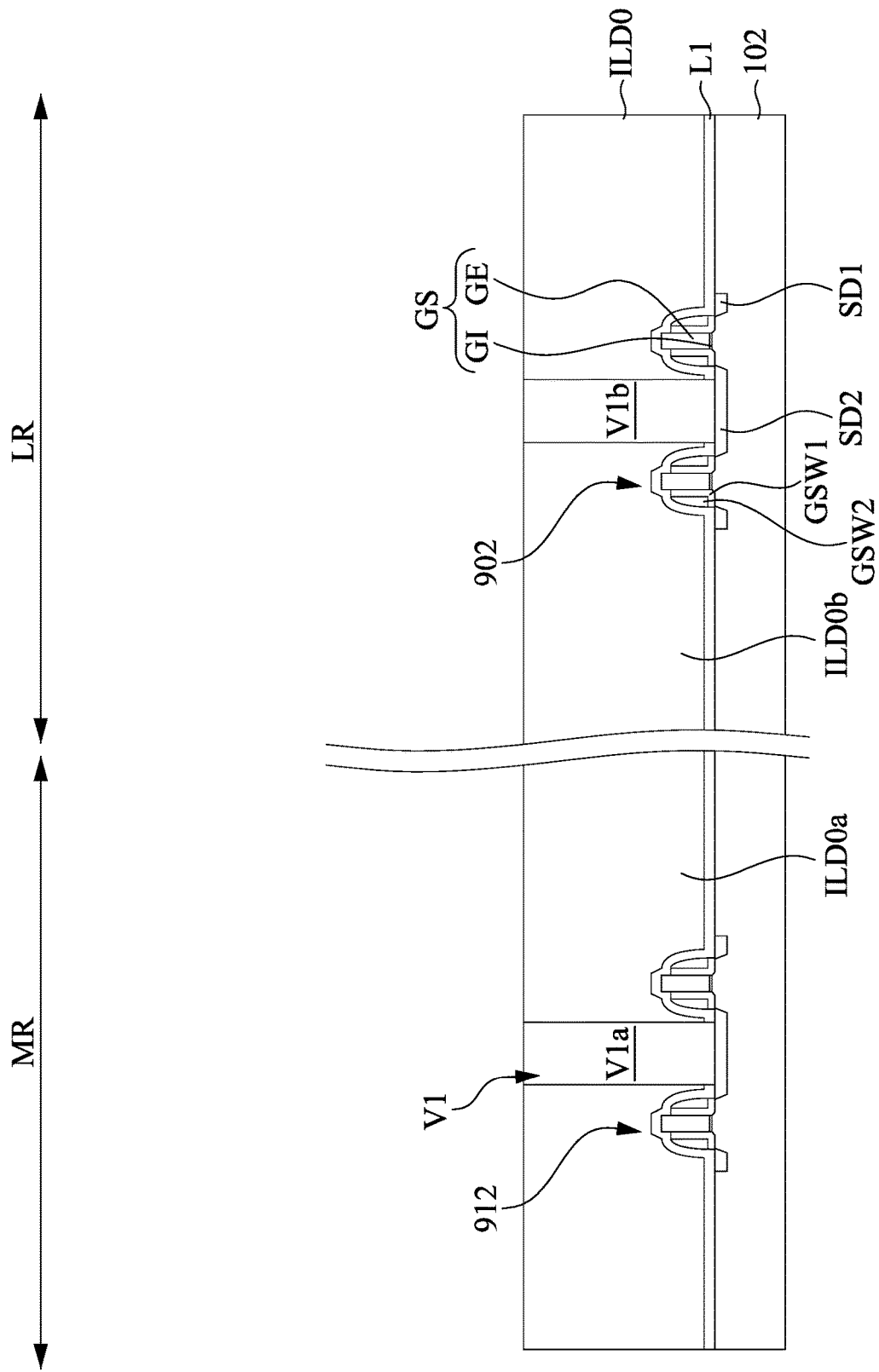
FIGS. 15-18 illustrate various stages in the fabrication process of an integrated circuit device according to some embodiments of the present disclosure.

FIG. 15 illustrates a semiconductor substrate 102 having transistors 902 and 912 formed thereon, in which the transistors 902 and 912 are respectively on a logic region LR and a memory region MR of the semiconductor substrate 102. The semiconductor substrate 102 may be a silicon substrate. Alternatively, the substrate 102 may include another elementary semiconductor, such as germanium; a compound semiconductor including silicon carbide; an alloy semiconductor including silicon germanium; or combinations thereof. In some embodiments, the substrate 102 is a semiconductor on insulator (SOI) substrate. The substrate 102 may include doped regions, such as p-wells and n-wells. The transistors 902 and 912 are formed by suitable transistor fabrication processes and may be a planar transistor, such as polysilicon gate transistors or high-k metal gate transistors, or a multi-gate transistor, such as fin field effect transistors.

In the present embodiments, each of the transistors 902 and 912 may include a gate structure GS, a first source/drain region SD1, a second source/drain region SD. In some embodiments, the gate structure GS is over and/or around a channel region of the substrate 102, and the first and second source/drain regions SD1 and SD2 are on opposite sides of the channel region of the substrate 102. The gate structure GS may include a gate dielectric GI and a gate electrode GE over the gate dielectric GI. In some embodiments, gate spacers GSW1 and GSW2 may be formed on opposite sides of the gate structure GS and span the first and second source/drain regions SD1 and SD2 from the gate structure GS.

After the transistors 902 and 912 are formed, an ILD layer ILD0 is deposited over the transistors 902 and 912. The ILD layer ILD0 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

Subsequently, conductive vias V1 are formed in the ILD layer ILD0 and connected with the second source/drain regions SD2 of the transistors 902 and 912. In some embodiments, the conductive vias V1 may be a contact via landing on the second source/drain regions SD2, and silicide regions may be formed between the contact via and the second source/drain regions SD2. In some embodiments, the conductive vias V1 may be conductive feature landing on a source/drain contact over the second source/drain regions SD2, and silicide regions may be formed between the second source/drain regions SD2 contact and the second source/drain regions SD2. The conductive vias V1 may be made of aluminum, aluminum alloy, copper, copper alloy, titanium, titanium nitride, tantalum, tantalum nitride, tungsten, cobalt, the like, and/or combinations thereof. Formation of the conductive vias V1 may include etching contact openings in the ILD layer ILD0 exposing the second source/drain regions SD2 or the source/drain contacts over and connected to the second source/drain regions SD2, filling the contact opening with the conductive material, and planarizing the conductive material and the ILD layer ILD0. In some embodiments, prior to the formation of the ILD layer ILD0, a resist protect oxide (RPO) layer L1 is formed over the transistors 902 and 912 and the substrate 102 to protect areas under the RPO layer L1 from a silicide process. The RPO layer L1 may be made of silicon oxide, silicon nitride, silicon oxynitride, the like, or the combination thereof. For better illustration, the conductive via V1 in the memory region MR is labelled as a conductive via V1a, and the conductive via V1 in the logic region LR is referred to as a conductive via V1b, and portions of the ILD layer ILD0 in the memory region MR and the logic region LR are referred to as portions ILD0a and ILD0b, respectively.

Figure 16:
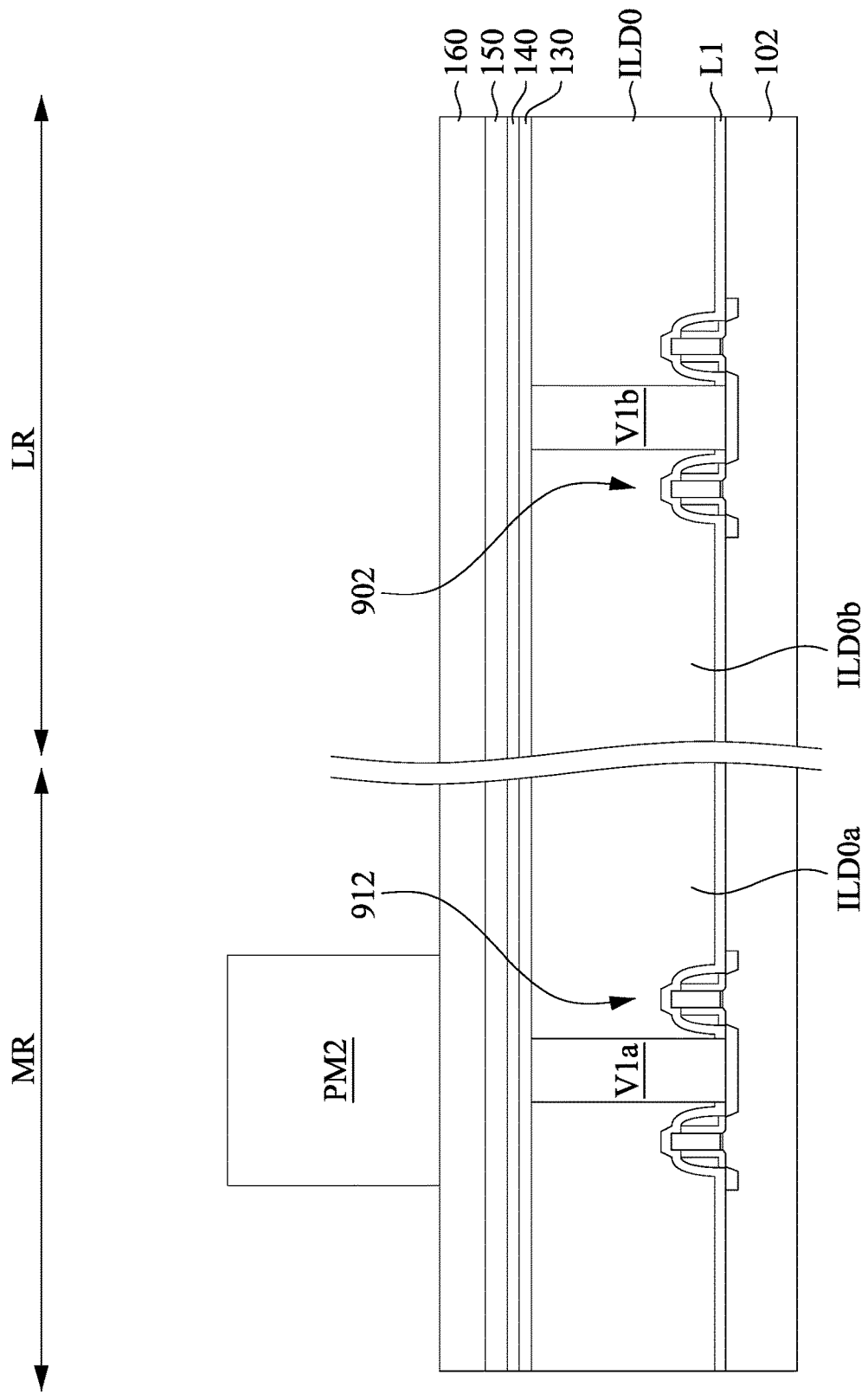

Reference is made to FIG. 16. A plurality of memory layers are formed over the ILD layer ILD0 and the conductive vias V1a and V1b in a sequence. For example, the memory layers may include a bottom electrode stack layer 130, a resistance switching layer 140, a capping layer 150, and a top electrode layer 160 formed in a sequence. In some embodiments, a bottommost layer of the memory layers (e.g., the bottom electrode stack layer 130 in the present embodiments) is in contact with the conductive vias V1a, V1b and the portions ILID0a and ILD0b of the ILD layer ILD0. In some other embodiments, the bottom electrode stack layer 130 may be omitted, and the bottommost layer of the memory layers (e.g., the resistance switching layer 140 in the embodiments) is in contact with the conductive vias V1a, V1b and the portions ILID0a and ILD0b of the ILD layer ILD0. Details regarding the formation of the memory layers are similar to those previously described, and therefore not repeated herein.

Still Reference is made to FIG. 16. A resist layer is formed over the top electrode layer 160, and then patterned into a patterned resist mask PM2 using a suitable photolithography process over the memory region MR, such that portions of the top electrode layer 160 are exposed by the patterned resist mask PM2. The patterned resist mask PM2 defines the positions of memory stacks. In some embodiments, the patterned resist mask PM2 is a photoresist. In some embodiments, the patterned resist mask PM2 is an ashing removable dielectric (ARD), which is a photoresist-like material having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 17:
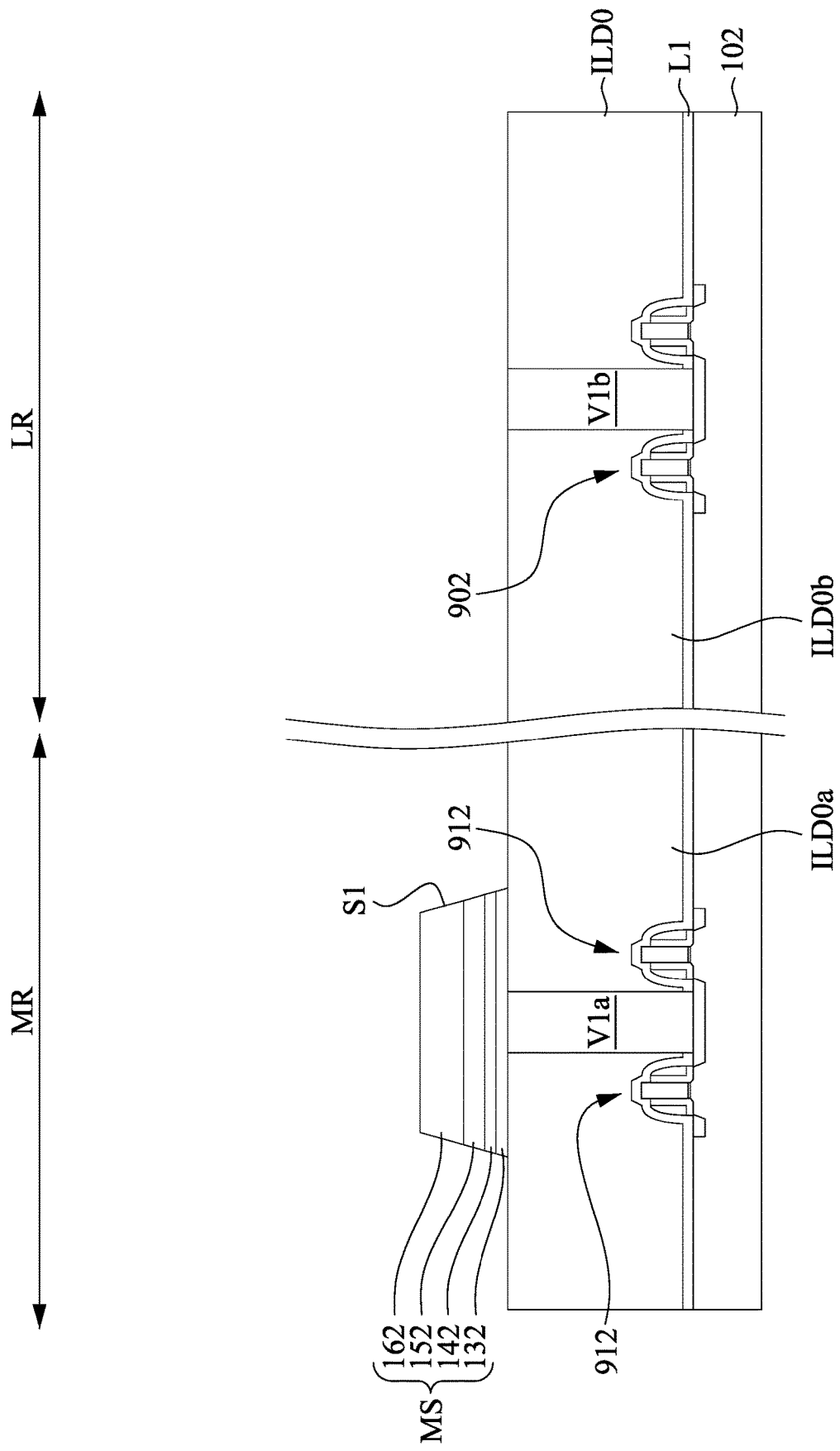

Reference is made to FIG. 17. The top electrode layer 160, the capping layer 150, and the resistance switching layer 140, and the bottom electrode stack layer 130 (referring to FIG. 3) are patterned into at least one a top electrode 162, at least one a capping layer 152, at least one a resistive switching element 142, and at least one bottom electrode 132, respectively. The patterning process may include an etching process using the patterned resist mask PM2 (referring to FIG. 3) as an etch mask. For example, the etching process may be a dry etching process. Through the patterning process, a memory structure MS is formed over the conductive via V1a over the memory region MR. In some embodiments of the present embodiments, sine the memory structure MS is formed by cutting (e.g., etching) the layers 130-160 (referring to FIG. 3) using one single mask PM2 (referring to FIG. 3), the memory structure MS may taper upward. For example, the memory structure MS have a sidewall S1 inclined with a top surface of the substrate. Details regarding the patterning process are similar to those previously described, and therefore not repeated herein.

Figure 18:
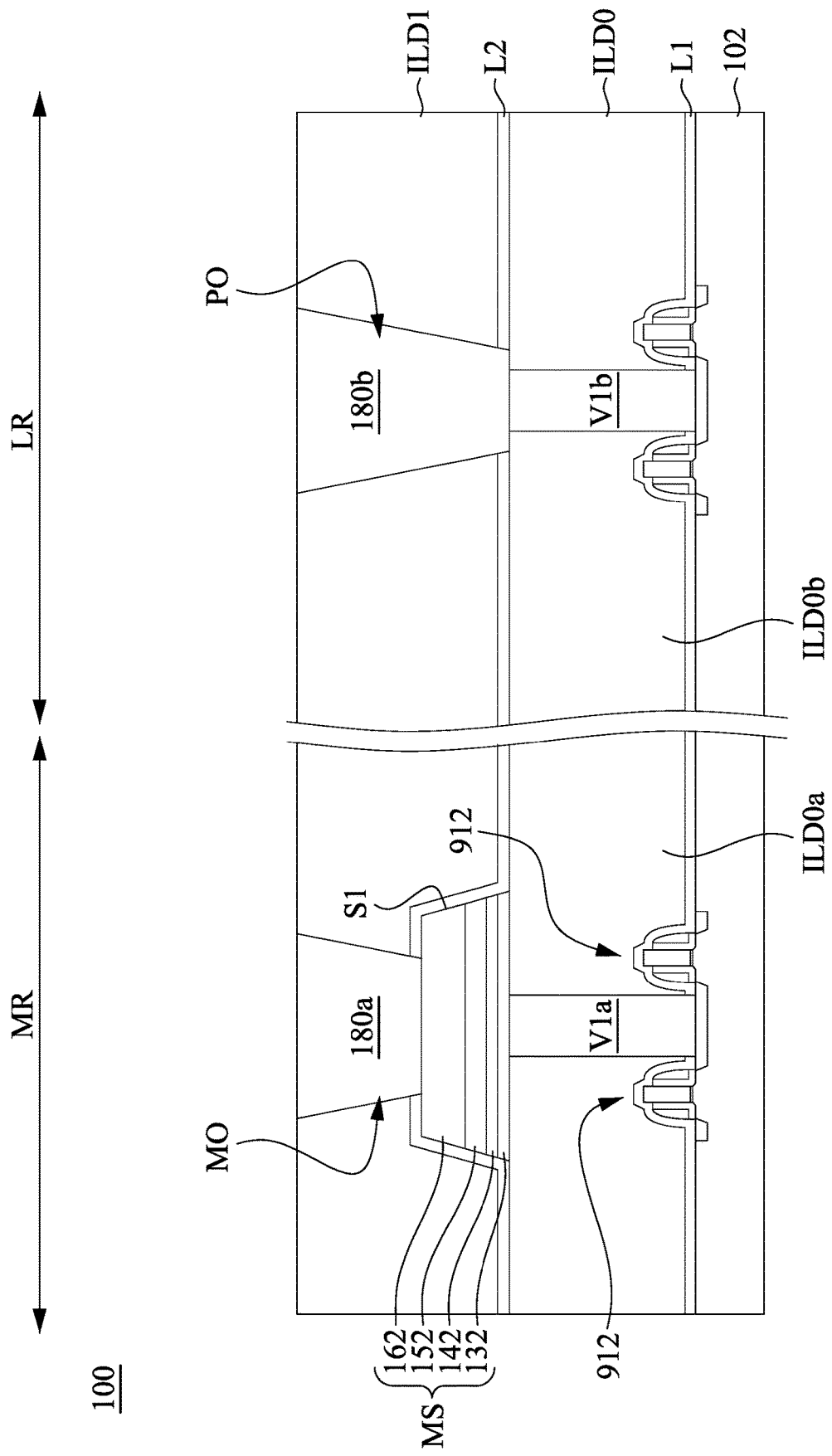

Reference is made to FIG. 18. An ILD layer ILD1 is deposited over the memory structure MS, the ILD layer ILD0, and conductive vias V1a and V1b using suitable deposition techniques. The ILD layer ILD1 may be silicon oxide, extreme or extra low-k silicon oxide such as a porous silicon oxide layer. For example, the ILD layer ILD1 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. In some embodiments, prior to the formation of the ILD layer ILD1, a dielectric layer L2 is deposited conformally over the memory structure MS, the ILD layer ILD0, and conductive vias V1a and V1b using suitable deposition techniques. The dielectric layer L2 may include silicon carbide, silicon oxide, silicon oxynitride, silicon nitride, the like, or the combination thereof.

After the formation of the ILD layer ILD1, a top electrode opening MO and an interconnect opening PO are etched in the ILD layer ILD1 and the dielectric layer L2. In some embodiments, the top electrode opening MO and the interconnect opening PO are trench openings, and formation of the top electrode opening MO and the interconnect opening PO may include a trench etching process and a liner removal process.

The trench etching process may include suitable anisotropic etching processes. In some embodiments where the ILD layer 170 is silicon oxide, the etchant used in the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. In some embodiments, in the logic region LR, the dielectric layer L2 may have a higher etch resistance to the trench etching process than that of the ILD layer ILD1, such that the trench etching process may stop at the dielectric layer L2. The dielectric layer L2 may be referred to as an etch stop layer in some embodiments.

After the trench etching process, the liner removal process may be performed to remove portions of the dielectric layer L2 exposed by the openings MO and PO, such that the opening MO may expose the top electrode 162, and the opening PO may expose the underlying conductive via V1b. The liner removal process may include one or more isotropic etching processes, such as dry etching processes using $CH_2F_2$ and Ar as etching gases. In some embodiments, the top electrode 162 and the conductive via V1b may have a higher etch resistance to the liner removal process than that of the dielectric layer L2, such that the liner removal process may stop at the top electrode 162 and the conductive via V1b and not damage the underlying layers.

After the formation of the top electrode opening MO and the interconnect opening PO, the top electrode opening MO and the interconnect opening PO are filled with a conductive material. The conductive material may include a metal conductor, such as aluminum, aluminum alloy, copper, copper alloy, titanium, titanium nitride, tantalum, tantalum nitride, tungsten, cobalt, the like, and/or combinations thereof. The metal conductor may be deposited using PVD or one of the plating methods, such as electrochemical plating. The conductive material may also include one or more liner and barrier layers in additional a metal conductor. The liner and/or barrier may be conductive and deposited using CVD or PVD. After filling the conductive material, a planarization process, such as chemical mechanical polishing (CMP), is performed to remove excess conductive material out of the top electrode opening MO and the interconnect opening PO.

Through the process, a conductive feature 180a is formed in the top electrode opening MO in the memory region MR and in contact with the top electrode 162, and a conductive feature 180b is formed in the interconnect opening PO in the logic region LR and in contact with the conductive via V1b. In the present embodiments, the conductive features 180a and 180b are conductive lines, which may be referred to as a metallization layer M1. In some embodiments, a combination of a height of the conductive features 180a and a height of the memory structure MS is substantially equal to a height of the conductive features 180b. In some embodiments, due to loading issues, a top surface of the conductive vias V1a and V1b may be higher than a top surface of the ILD layer ILD0, such that a bottom surface of the bottommost layer of the memory structure MS is lower than a top of the conductive vias V1.

In some embodiments of the present disclosure, an integrated circuit device 100 including the memory structure MS can be fabricated using a mask (e.g., the patterned resist mask PM2 in FIG. 16), thereby saving the cost and simplifying the process, which in turn will increase the throughput. In some embodiments of the present disclosure, the memory structure MS may be formed by cutting (e.g., etching) the layers 130-160 (referring to FIG. 16) using one mask (e.g., the patterned resist mask PM2 in FIG. 16), and then one clean process is performed after the cutting. Since no clean process is required after etching the top electrode layer 160 (referring to FIG. 16) and prior to etching the resistance switching layer 140 (referring to FIG. 16), the fabrication process is further simplified. Further, since the memory structure MS may be formed without using a spacer around the top electrode 162 to define the bottom electrode, the fabrication process is further simplified. In some embodiments of the present disclosure, without a dielectric layer in the memory region MR, the cell step height is reduced, which is beneficial for integrating the memory structure MS into the multi-level interconnect. In some embodiments, the metal landing of a conductive line over the top electrode of the memory structure has larger process window than that of a top electrode via landing. In some embodiments, the cell step height can be further reduced by omitting a copper barrier of the bottom electrode of the memory structure.

Although the memory structure MS is connected with the second source/drain region SD2 shared by two transistors 912 in the present embodiments, in some other embodiments, the memory structure MS may be electrically connected to the second source/drain region SD2 of one transistor 912, which will be illustrated in FIG. 26 later.

Figure 19:
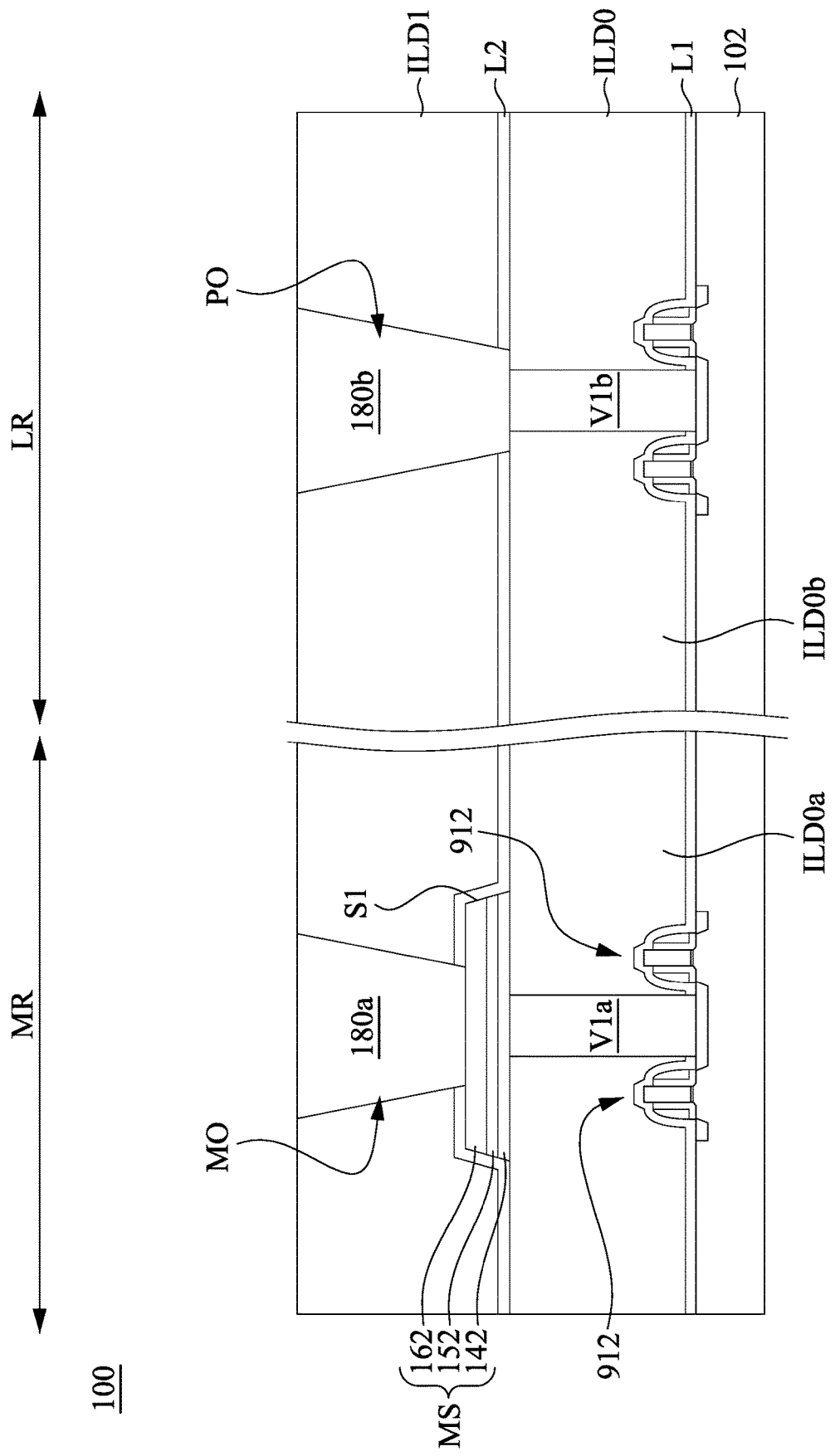
FIG. 19 is a schematic cross-sectional view of an integrated circuit device in accordance with some embodiments of the present disclosure.

FIG. 19 is a schematic cross-sectional view of an integrated circuit device 100 in accordance with some embodiments of the present disclosure. The present embodiments are similar to the embodiments of FIGS. 15-18, except that the bottom electrode 132 is omitted from the memory structure MS in the present embodiments. For example, the resistance switching element 142 is in contact with a top surface of the conductive via V1a. In the present embodiments, when depositing the memory layers as illustrated in FIG. 16, the bottom electrode stack layer 130 may be omitted, and the bottommost layer of the memory layers (e.g., the resistance switching layer 140 in the embodiments) is in contact with the conductive vias V1a, V1b and the ILD layer ILD0 in the memory region MR and the logic region LR. Other details of the present embodiments are the same as that discussed previously with respect to FIGS. 15-18, and therefore not repeated for the sake of brevity.

Figure 20:
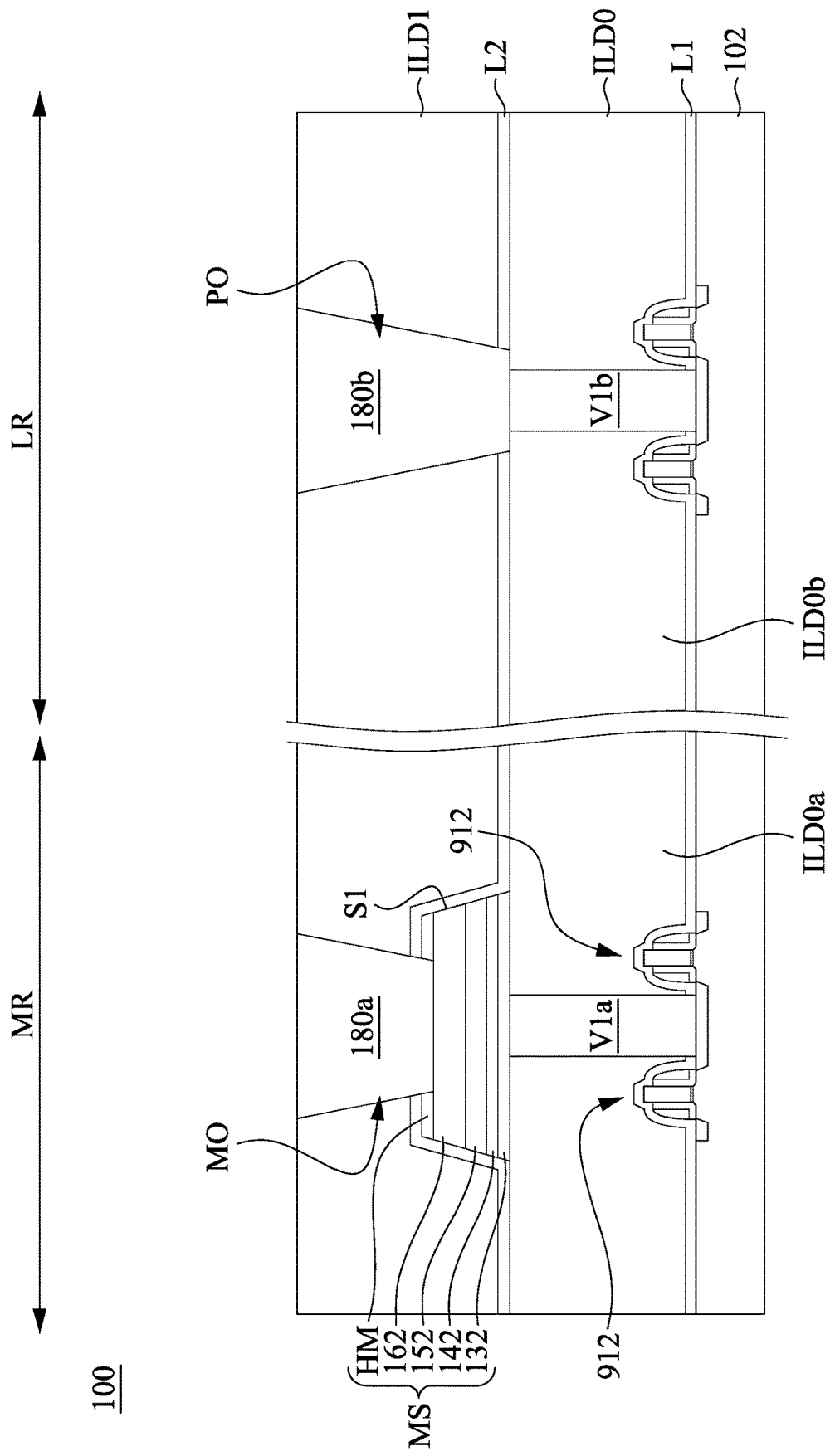
FIG. 20 is a schematic cross-sectional view of an integrated circuit device in accordance with some embodiments of the present disclosure.

FIG. 20 is a schematic cross-sectional view of an integrated circuit device 100 in accordance with some embodiments of the present disclosure. The present embodiments are similar to the embodiments of FIGS. 15-18, except that a hard mask HM is formed over the memory structure MS. The hard mask HM may include suitable dielectric materials (e.g., SiON, SiN, SiC, SiCN, $SiO_x$) or conductive materials, such as metal or metal-containing compounds. In the present embodiments, the conductive feature 180a may penetrate through the hard mask HM and be in direct contact with the top electrode 162. In some other embodiments, the hard mask HM may be electrically conductive, and the conductive feature 180a may not penetrate through the hard mask HM and not be in direct contact with the top electrode 162. In some embodiments, a hard mask layer may be formed over the top electrode layer 160 (referring to FIG. 16), and then patterned using the patterned resist mask PM2 as etch mask, thereby forming the hard mask HM. Other details of the present embodiments are the same as that discussed previously with respect to FIGS. 15-18, and therefore not repeated for the sake of brevity.

Figure 21:
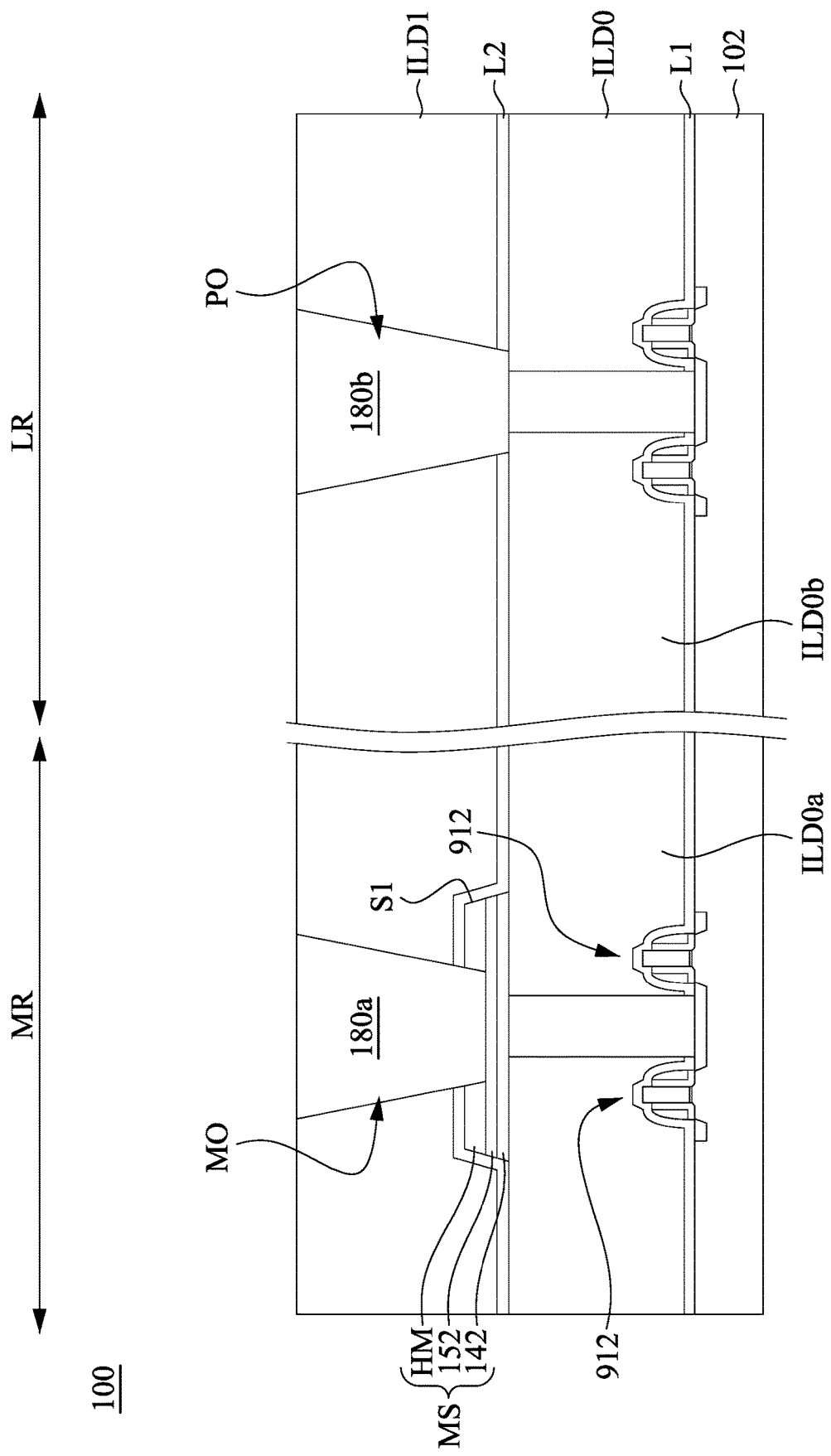
FIG. 21 is a schematic cross-sectional view of an integrated circuit device in accordance with some embodiments of the present disclosure.

FIG. 21 is a schematic cross-sectional view of an integrated circuit device 100 in accordance with some embodiments of the present disclosure. The present embodiments are similar to the embodiments of FIG. 19, except that the top electrode 162 and the bottom electrode 132 are omitted from the memory structure MS in the present embodiments. For example, the resistance switching element 142 is in contact with a top surface of the conductive via V1a, and the conductive feature 180a is in contact with a top surface of the capping layer 152. In the present embodiments, when depositing the memory layers as illustrated in FIG. 16, the bottom electrode stack layer 130 and the top electrode layer 160 may be omitted, and the bottommost layer of the memory layers (e.g., the resistance switching layer 140 in the embodiments) is in contact with the conductive vias V1a, V1b and the ILD layer ILD0 in the memory region MR and the logic region LR. Other details of the present embodiments are the same as that discussed previously with respect to FIGS. 15-18, and therefore not repeated for the sake of brevity.

Figure 22:
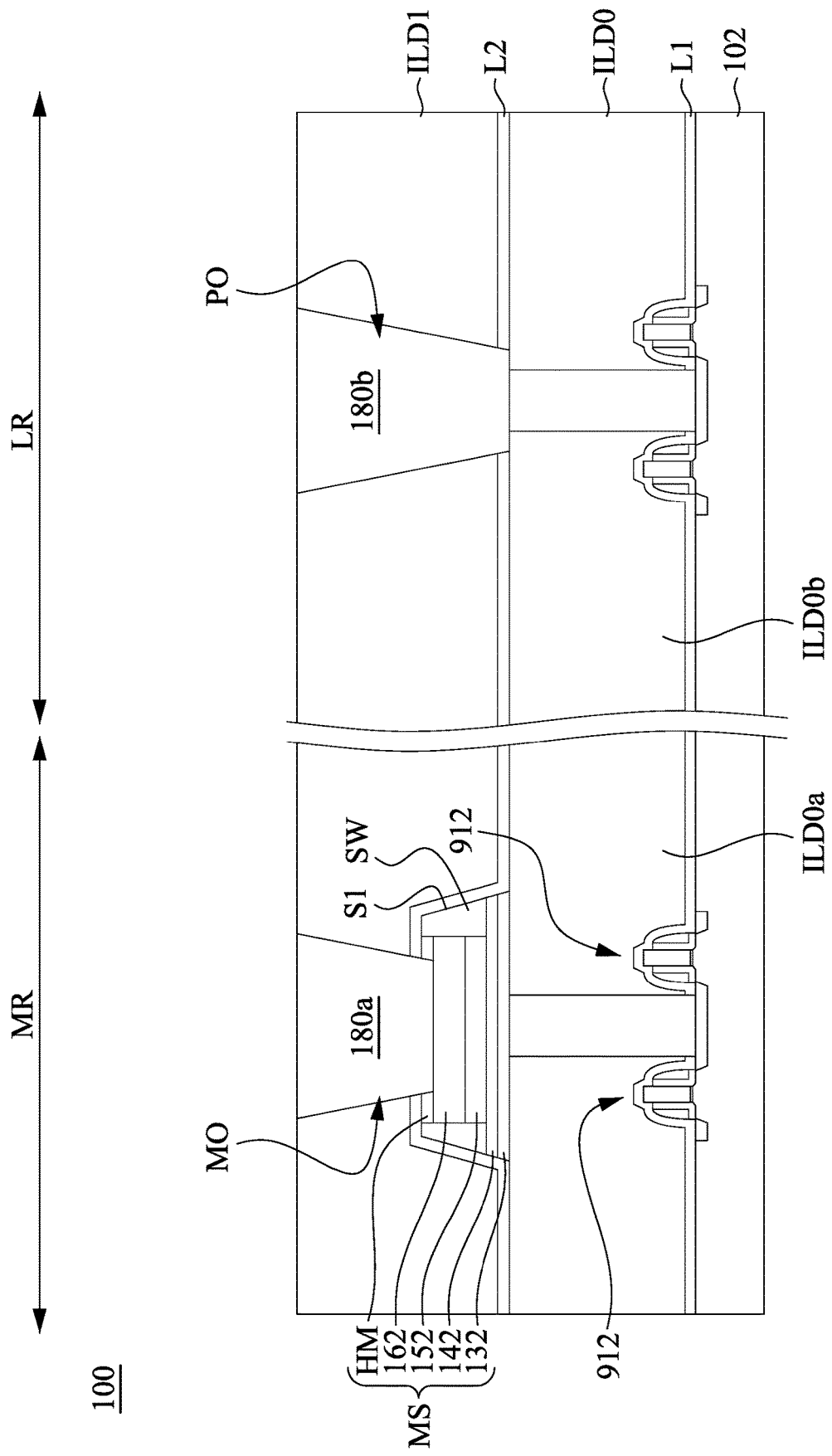
FIG. 22 is a schematic cross-sectional view of an integrated circuit device in accordance with some embodiments of the present disclosure.

FIG. 22 is a schematic cross-sectional view of an integrated circuit device 100 in accordance with some embodiments of the present disclosure. The present embodiments are similar to the embodiments of FIG. 20, except that that the memory structure MS is formed with spacer SW surrounding the capping layer 152, the top electrode 162, and the hard mask HM, thereby defining the underlying bottom electrode 132. In the present embodiments, the hard mask HM is first formed over the top electrode layer 160 (referring to FIG. 16), and then the top electrode layer 160 and the capping layer 150 are respectively patterned into the top electrode 162 and the capping layer 152 by suitable etching process. Subsequently, in the present embodiments, the spacer SW is formed around the hard mask HM, the top electrode 162, and the capping layer 152, and then the resistance switching layer 140 and the bottom electrode layer 130 are patterned, using the spacers and the hard mask HM as mask, into the resistance switching element 142 and the bottom electrode 132, respectively. Other details of the present embodiments are the same as that discussed previously with respect to FIG. 20, and therefore not repeated for the sake of brevity.

Figure 23:
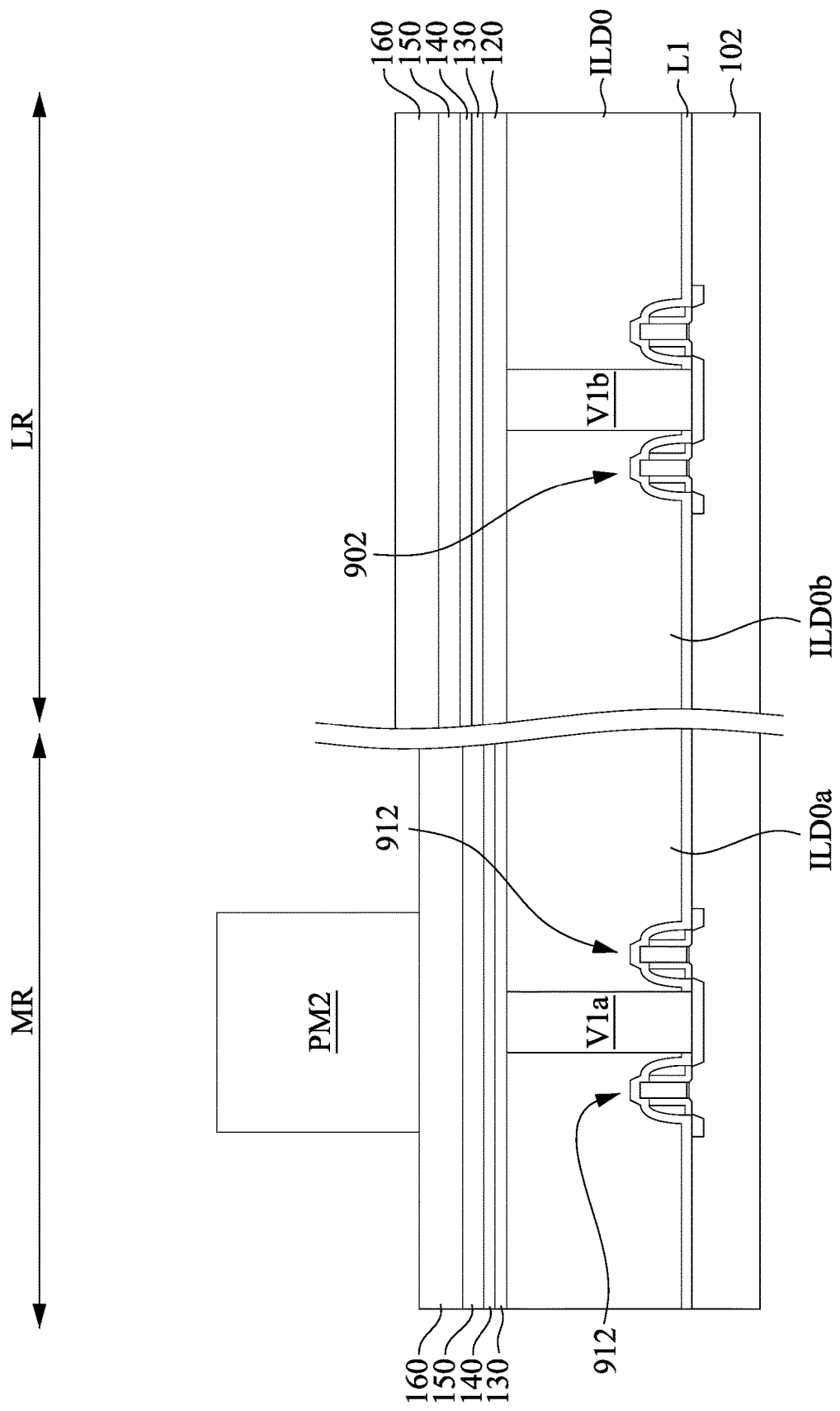
FIGS. 23-25 illustrate various stages in the fabrication process of an integrated circuit device according to some embodiments of the present disclosure.
Figure 24:
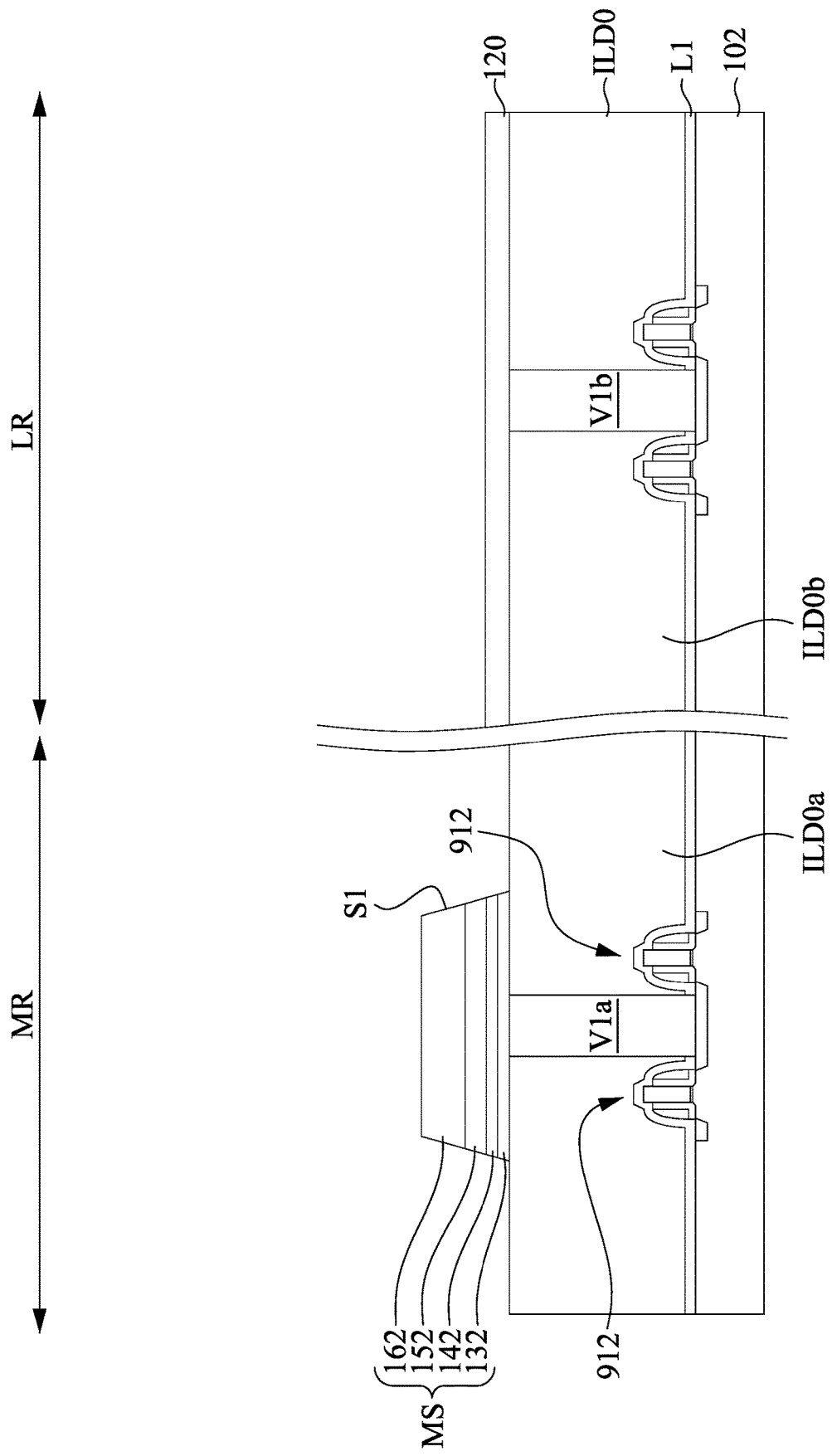
Figure 25:
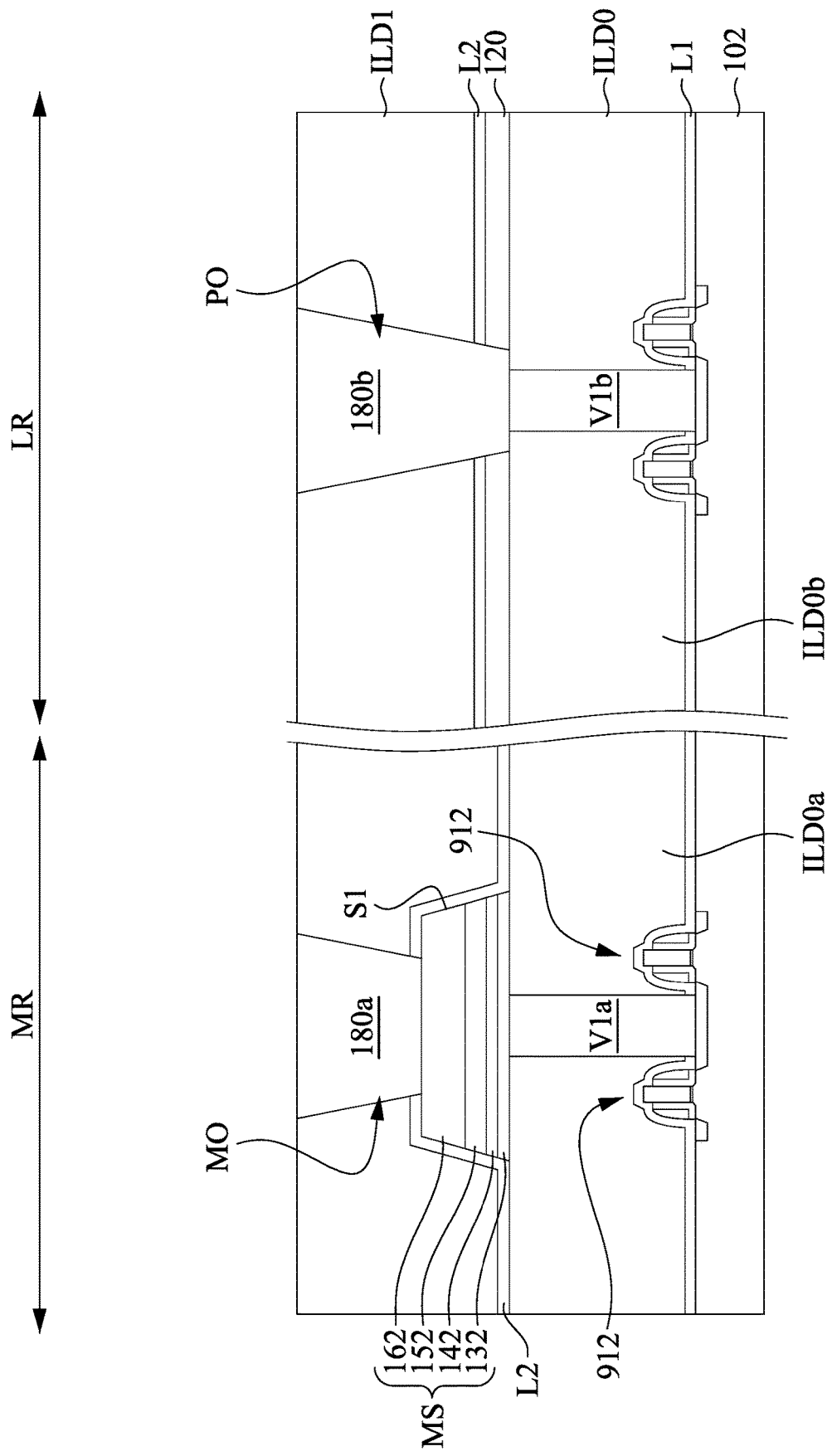

FIGS. 23-25 illustrate various stages in the fabrication process of an integrated circuit device 100 according to some embodiments of the present disclosure. The present embodiments are similar to the embodiments of FIGS. 15-18, except that a dielectric layer 120 is formed over the conductive via V1b in the logic region LR prior to the formation of the memory layers.

Reference is made to FIG. 23. A plurality of memory layers are formed over the ILD layer ILD0 and the dielectric layer 120 in a sequence. For example, the memory layers may include a bottom electrode stack layer 130, a resistance switching layer 140, a capping layer 150, and a top electrode layer 160 formed in a sequence. In some embodiments, a bottommost layer of the memory layers (e.g., the bottom electrode stack layer 130 in the present embodiments) is in contact with the dielectric layer 120, the conductive via V1a, and a portion ILD0a of the ILD layer ILD0 in the memory region MR. In some other embodiments, the bottom electrode stack layer 130 may be omitted, and the bottommost layer of the memory layers (e.g., the resistance switching layer 140 in the embodiments) is in contact with the dielectric layer 120, the conductive via V1a, and a portion ILD0a of the ILD layer ILD0 in the memory region MR. The memory layers may be spaced apart from the conductive via V1b and a portion ILD0b of the ILD layer ILD0 in the logic region LR by the dielectric layer 120. Subsequently, the patterned resist mask PM2 is formed over the memory layers by suitable photolithography process. The patterned resist mask PM2 defines the positions of memory stacks.

Reference is made to FIG. 24. The top electrode layer 160, the capping layer 150, and the resistance switching layer 140, and the bottom electrode stack layer 130 (referring to FIG. 3) are patterned, thereby forming a memory structure MS over the conductive via V1a over the memory region MR. The memory structure MS may be free of contacting with the dielectric layer 120.

Reference is made to FIG. 25. In some embodiments, an ILD layer ILD1 is deposited over the memory structure MS, the ILD layer ILD0, and conductive vias V1a and V1b using suitable deposition techniques. Subsequently, a top electrode opening MO and an interconnect opening PO are etched in the ILD layer ILD and the dielectric layer L2, in which the interconnect opening PO is further etched through the dielectric layer 120. The interconnect opening PO, the top electrode opening MO and the interconnect opening PO are filled with a conductive material, thereby forming a conductive feature 180a in contact with the top electrode 162, and a conductive feature 180b in contact with the conductive via V1b.

Figure 26:
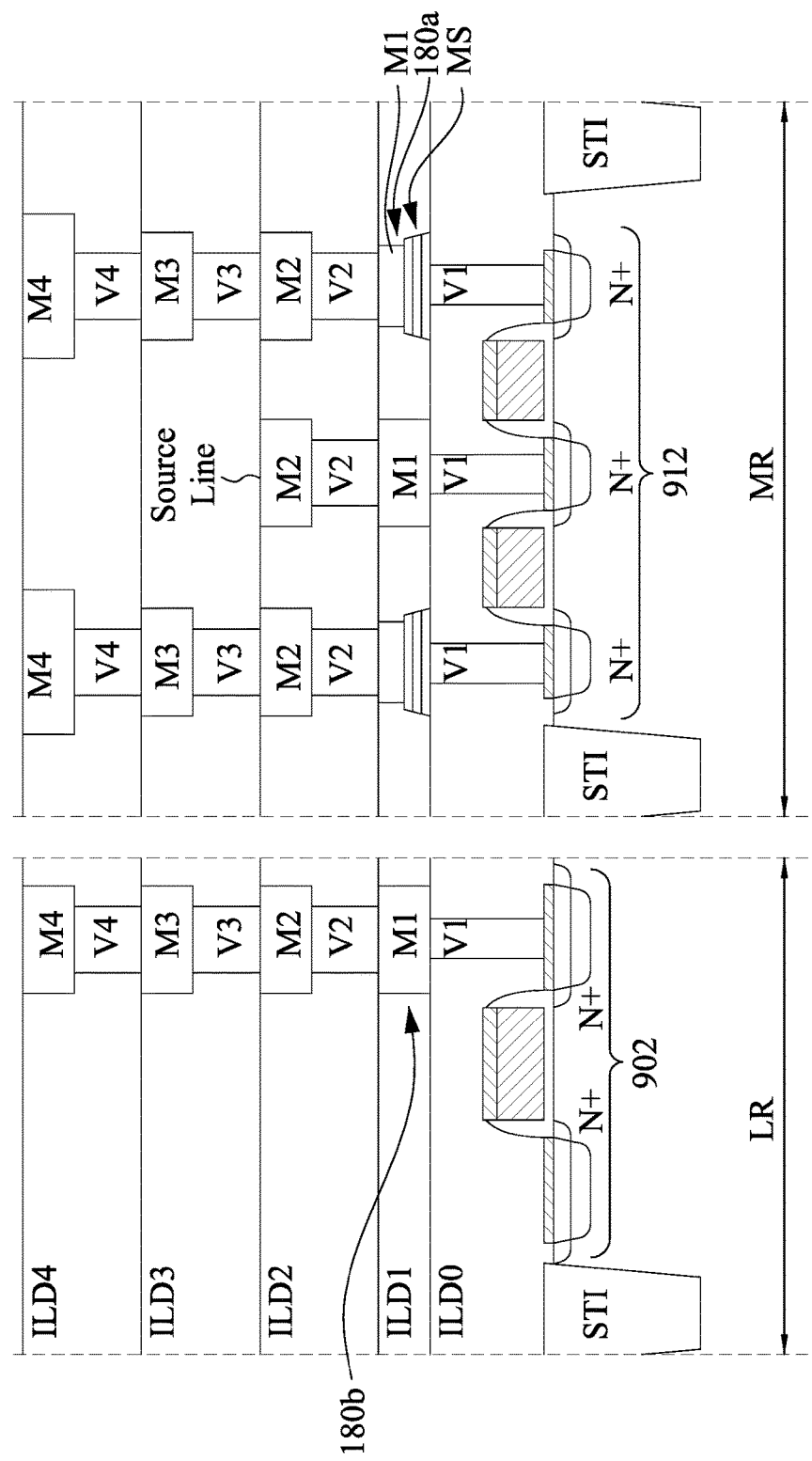
FIG. 26 is a schematic cross-sectional view of an integrated circuit device in accordance with some embodiments of the present disclosure.

FIG. 26 is a schematic cross-sectional view of an integrated circuit device 100 in accordance with some embodiments of the present disclosure. The semiconductor device includes a logic region LR and a memory region MR. Logic region LR may include circuitry, such as an exemplary logic transistor 902, for processing information received from the memory structures MS in the memory region MR and for controlling reading and writing functions of the memory structures MS.

As depicted, the semiconductor device is fabricated using four metallization layers, labeled as M1 through M4, with four layers of metallization vias or interconnects, labeled as V1 through V4. Other embodiments may contain more or fewer metallization layers and a corresponding more or fewer number of vias. Logic region LR includes a full metallization stack, including a portion of each of metallization layers M1-M4 connected by vias V2-V4, with V1 connecting the stack to a source/drain contact of logic transistor 902. The memory region MR includes a full metallization stack connecting memory structures MS to transistors 912 in the memory region MR, and a partial metallization stack connecting a source line to transistors 912 in the memory region MR. Memory structures MS are depicted as being fabricated in between the top of the vias V1 and the bottom of the M1 layer. In some embodiments, the memory structures MS may be similar to those shown above. For example, the M1 layer has conductive features 180a and a conductive line 118b respectively in the memory region MR and the logic region LR, and the memory structures MS is between the conductive features 180a and the via V1. Also included in semiconductor device is a plurality of ILD layers. Five ILD layers, identified as ILD0 through ILD4 are depicted in FIG. 26 as spanning the logic region LR and the memory region MR. The ILD layers may provide electrical insulation as well as structural support for the various features of the semiconductor device during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the integrated circuit device including a memory cell can be fabricated using a high-grade mask or a combination of a low-grade mask and a high-grade mask, thereby saving the cost and simplifying the process, which in turn will increase the throughput. Another advantage is that since the memory cells may be formed by cutting (e.g., etching) the bottom electrode layer, the resistance switching layer, and the top electrode layer using one single high-grade mask, a single clean process is performed after the cutting, which will further simplify the process. Still another advantage is that the memory structure is formed on the conductive pad without a via structure interposed therebetween, thereby reducing the cell step height, which is beneficial for integrating memory cells into the multi-level interconnect. Still another advantage is that the bottom electrode and/or the top electrode may be omitted from the memory structure, thereby reducing the cell step height. Still another advantage is that since the memory structure is formed on a conductive via connected to the transistor without a dielectric layer covering the memory region, the cell step height is reduced. Still another advantage is that the metal landing of a conductive line over the top electrode of the memory structure has larger process window than that of a top electrode via landing.

According to some embodiments of the present disclosure, a method for fabricating an integrated circuit device is provided. The method includes forming an interconnect layer over a substrate, wherein the interconnect layer has a first interlayer dielectric layer, a first conductive feature in a first portion of the first interlayer dielectric layer, and a second conductive feature in a second portion of the first interlayer dielectric layer; depositing a dielectric layer over the interconnect layer; removing a first portion of the dielectric layer over the first conductive feature and the first portion of the first interlayer dielectric layer, and remaining a second portion of the dielectric layer over the second conductive feature and the second portion of the first interlayer dielectric layer; and forming a memory structure over the first conductive feature. The memory structure includes a bottom electrode over and in contact with the first conductive feature, a resistance switching element over the bottom electrode, and a top electrode over the resistance switching element.

According to some embodiments of the present disclosure, a method for fabricating an integrated circuit device is provided. The method includes forming an interconnect layer over a substrate, wherein the interconnect layer has an interlayer dielectric layer and a conductive pad in the interlayer dielectric layer; and forming a memory structure over the conductive pad. The memory structure includes a bottom electrode over and in contact with the conductive pad, a resistance switching element over the bottom electrode, and a top electrode over the resistance switching element.

According to some embodiments of the present disclosure, an integrated circuit device includes a substrate, an interlayer dielectric layer, a conductive pad, and a memory structure. The interlayer dielectric layer is over the substrate. The conductive pad is embedded in the interlayer dielectric layer. The memory structure includes a bottom electrode over and in contact with the conductive pad, a resistance switching element over the bottom electrode, and a top electrode over the resistance switching element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   an interconnect layer comprising a first conductive feature and a second conductive feature;
   a memory structure over and in contact with the first conductive feature, wherein the memory structure comprises at least a resistance switching element over the first conductive feature;
   a third conductive feature over and in contact with the second conductive feature, wherein the third conductive feature comprises a first conductive line; and
   a fourth conductive feature over and in contact with the memory structure, wherein the fourth conductive feature comprises a second conductive line, a top surface of the first conductive line is substantially level with a top surface of the second conductive line, and a bottom surface of the first conductive line is lower than a bottommost portion of a bottom surface of the second conductive line.

2. The integrated circuit device of claim 1, wherein the third conductive feature further comprises a first conductive via between the first conductive line and the second conductive feature, and a width of the first conductive via is less than a width of the first conductive line.

3. The integrated circuit device of claim 2, further comprising:
   a dielectric layer over the interconnect layer, wherein the dielectric layer surrounds the first conductive via, and the dielectric layer is spaced apart from the memory structure.

4. The integrated circuit device of claim 3, wherein a top surface of the dielectric layer is spaced apart from the bottom surface of the first conductive line.

5. The integrated circuit device of claim 1, wherein the fourth conductive feature further comprises a second conducive via between the second conductive line and the memory structure, and a width of the second conductive via is less than a width of the second conductive line.

6. The integrated circuit device of claim 1, wherein the first conductive line has a substantially straight sidewall extending from the top surface of the first conductive line to the bottom surface of the first conductive line.

7. The integrated circuit device of claim 1, wherein the second conductive line has a substantially straight sidewall extending from the top surface of the second conductive line to the bottom surface of the second conductive line.

8. The integrated circuit device of claim 1, wherein the second conductive line is in direct contact with the memory structure.

9. An integrated circuit device, comprising:
   an interconnect layer, wherein the interconnect layer has an interlayer dielectric layer and a conductive pad in the interlayer dielectric layer;
   a memory structure over and in contact with the conductive pad, wherein the memory structure comprises at least a resistance switching element over the conductive pad and a top electrode over the resistance switching element; and
   a first conductive line over and in direct contact with the top electrode, wherein the top electrode has a first portion overlapping the first conductive line and a second portion nonoverlapping the first conductive line, and the first and second portions of the top electrode are aligned with each other along a direction perpendicular to a lengthwise direction of the first conductive line in a top view.

10. The integrated circuit device of claim 9, wherein the memory structure further comprises a substantially straight sidewall extending from a top surface of the interlayer dielectric layer of the interconnect layer.

11. The integrated circuit device of claim 9, wherein the memory structure further comprises a bottom electrode below the resistance switching element, and the bottom electrode is in direct contact with the conductive pad.

12. The integrated circuit device of claim 11, wherein the bottom electrode of the memory structure is further in direct contact with the interlayer dielectric layer of the interconnect layer.

13. The integrated circuit device of claim 9, wherein the conductive pad has a first portion overlapping the first conductive line and a second portion nonoverlapping the first conductive line, and the first and second portions of the conductive pad are aligned with each other along the direction perpendicular to the lengthwise direction of the first conductive line in the top view.

14. The integrated circuit device of claim 9, wherein the first conductive line has opposite first and second sidewalls, the first portion of the top electrode extends beyond the first sidewall of the first conductive line, and the second portion of the top electrode extends beyond the second sidewall of the first conductive line.

15. An integrated circuit device, comprising:
   a semiconductor substrate;
   a transistor over the semiconductor substrate;
   a first interlayer dielectric layer surrounding the transistor;
   a first conductive via and a second conductive via in the first interlayer dielectric layer, wherein the first conductive via is laterally aligned with the second conductive via;
   a memory structure over and in direct contact with a top surface of the first conductive via, wherein the memory structure comprises at least a resistance switching element over the first conductive via and a top electrode over and in contact with the resistance switching element;
   a first conductive line over and in direct contact with a top surface of the second conductive via;
   a third conductive via over and in direct contact with a top surface of the first conductive line, wherein the first conductive line extends beyond an entire width of the third conductive via;
   a second conductive line over and in contact with the top electrode of the memory structure; and
   a fourth conductive via over and in direct contact with a top surface of the second conductive line, wherein the fourth conductive via is laterally aligned with the third conductive via, and the second conductive line extends beyond an entire width of the fourth conductive via.

16. The integrated circuit device of claim 15, further comprising:
    a second interlayer dielectric layer surrounding the memory structure, the first conductive line, and the second conductive line.

17. The integrated circuit device of claim 15, wherein the memory structure and the second conductive line are laterally aligned with the first conductive line.

18. The integrated circuit device of claim 15, wherein the first conductive line extends beyond an entire width of the second conductive via.

19. The integrated circuit device of claim 15, wherein a bottom width of the memory structure is greater than a width of the top surface of the first conductive via.

20. The integrated circuit device of claim 15, wherein the first conductive via is connected with a first node of the transistor, and the second conductive via is connected with a second node of the transistor.

\* \* \* \* \*